United States Patent [19]
Ohsawa et al.

[11] Patent Number: 5,917,956
[45] Date of Patent: Jun. 29, 1999

[54] IMAGE PROCESSING APPARATUS CAPABLE OF REMOVING AN EDGE PORTION FROM A MULTI-LEVEL COLOR SIGNAL BASED ON A BINARY COLOR SIGNAL

[75] Inventors: Hidefumi Ohsawa, Kawaguchi; Yasuji Hirabayashi, Tokyo; Tadashi Yoshida, Ichikawa, all of Japan

[73] Assignee: Canon Kabushiki Kaisha, Tokyo, Japan

[21] Appl. No.: 08/908,379

[22] Filed: Aug. 7, 1997

Related U.S. Application Data

[62] Division of application No. 08/285,523, Aug. 4, 1994, Pat. No. 5,844,718, which is a continuation of application No. 07/664,868, Mar. 5, 1991, abandoned.

[30] Foreign Application Priority Data

| Mar. 5, 1990 | [JP] | Japan | 2-054528 |
| Mar. 5, 1990 | [JP] | Japan | 2-054529 |
| Jun. 1, 1990 | [JP] | Japan | 2-143704 |
| Jun. 1, 1990 | [JP] | Japan | 2-143705 |

[51] Int. Cl.$^6$ .................................................. H04N 1/417
[52] U.S. Cl. ...................... 382/266; 358/539; 358/262.1; 382/233
[58] Field of Search ................................ 358/426, 261.3, 358/262.1, 432, 539; 382/263, 266, 269, 235, 237, 233; 348/405, 420; H04N 1/417

[56] References Cited

U.S. PATENT DOCUMENTS

| 4,745,473 | 5/1988 | Hall | 358/426 |
| 4,873,577 | 10/1989 | Chamzas | 358/133 |
| 4,888,812 | 12/1989 | Dinan et al. | 382/57 |
| 4,947,259 | 8/1990 | Katsuta | 358/426 |
| 4,974,071 | 11/1990 | Maeda | 358/75 |
| 5,038,389 | 8/1991 | Mizuno | 358/433 |
| 5,075,788 | 12/1991 | Funada | 358/462 |
| 5,091,967 | 2/1992 | Ohsawa | 382/266 |
| 5,109,451 | 4/1992 | Aono et al. | 358/131 |
| 5,124,811 | 6/1992 | Ohsawa et al. | 358/426 |
| 5,126,838 | 6/1992 | Ohawa et al. | 358/75 |
| 5,177,603 | 1/1993 | Kojima | 358/453 |
| 5,283,664 | 2/1994 | Fujisawa et al. | 358/429 |
| 5,311,328 | 5/1994 | Muzata | 358/532 |
| 5,361,147 | 11/1994 | Katayama et al. | 358/532 |
| 5,363,219 | 11/1994 | Yoshida | 358/539 |
| 5,371,606 | 12/1994 | Katayama et al. | 358/426 |
| 5,416,606 | 5/1995 | Katayama et al. | 358/426 |

FOREIGN PATENT DOCUMENTS

| 261561 | 3/1988 | European Pat. Off. | H04N 11/02 |
| 0434429 | 6/1991 | European Pat. Off. | |

OTHER PUBLICATIONS

Langdon, Jr. et al., "Compression of Black–White Images with Arithmetic Coding", IEEE Transactions on Communications, pp. 858–867, vol. COM–29, No. 6, Jun. 1981.

*Primary Examiner*—Kim Yen Vu
*Attorney, Agent, or Firm*—Fitzpatrick, Cella, Harper & Scinto

[57] ABSTRACT

An image processing apparatus comprising binarization means for converting a multi-level color signal into binary form, removal means for removing edge component from the multi-level color signal, based on a binary color signal from said binarization means, and encoder means for encoding the binary color signal from said binarization means and the multi-level color signal having edge component removed with said removal means.

18 Claims, 23 Drawing Sheets

FIG. 6A   1ST COLOR   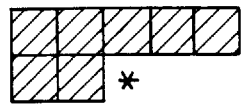   7 PIXELS
FIG. 6B   2ND COLOR   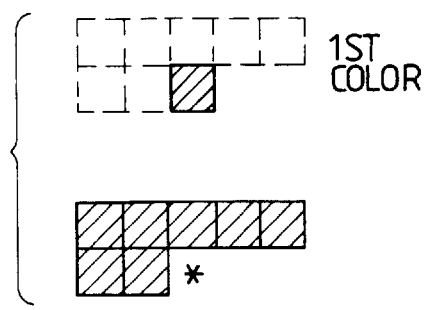   8 PIXELS
FIG. 6C   3RD COLOR   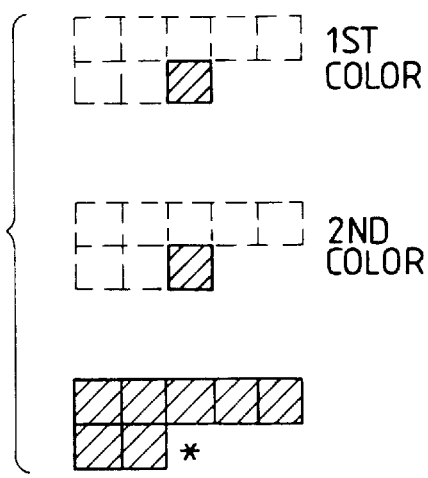   9 PIXELS FIG. 14A  1BIT (MSB)  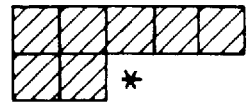  7 PIXELS
FIG. 14B  2BITS {  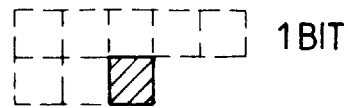 1BIT
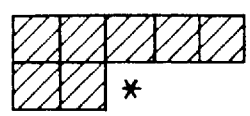 8 PIXELS }
FIG. 14C  3BITS {  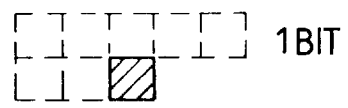 1BIT
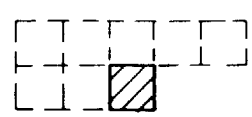 2BITS
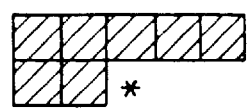 9 PIXELS }

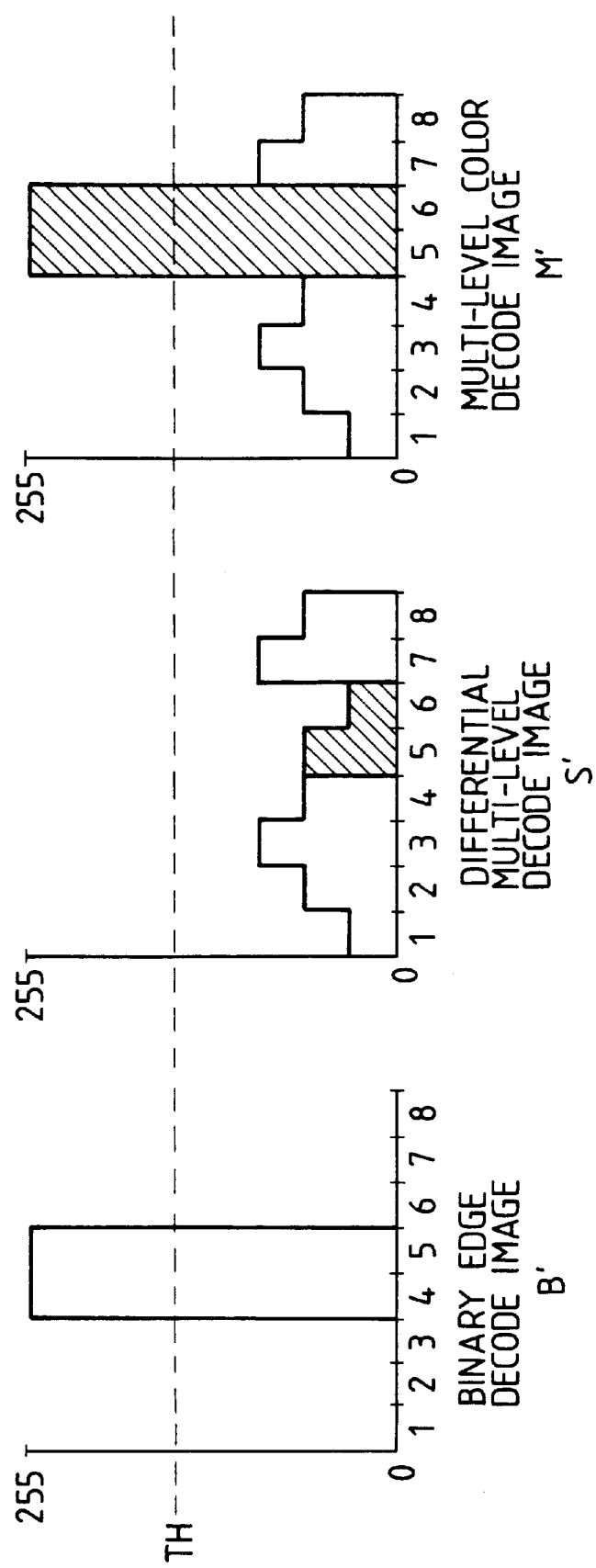

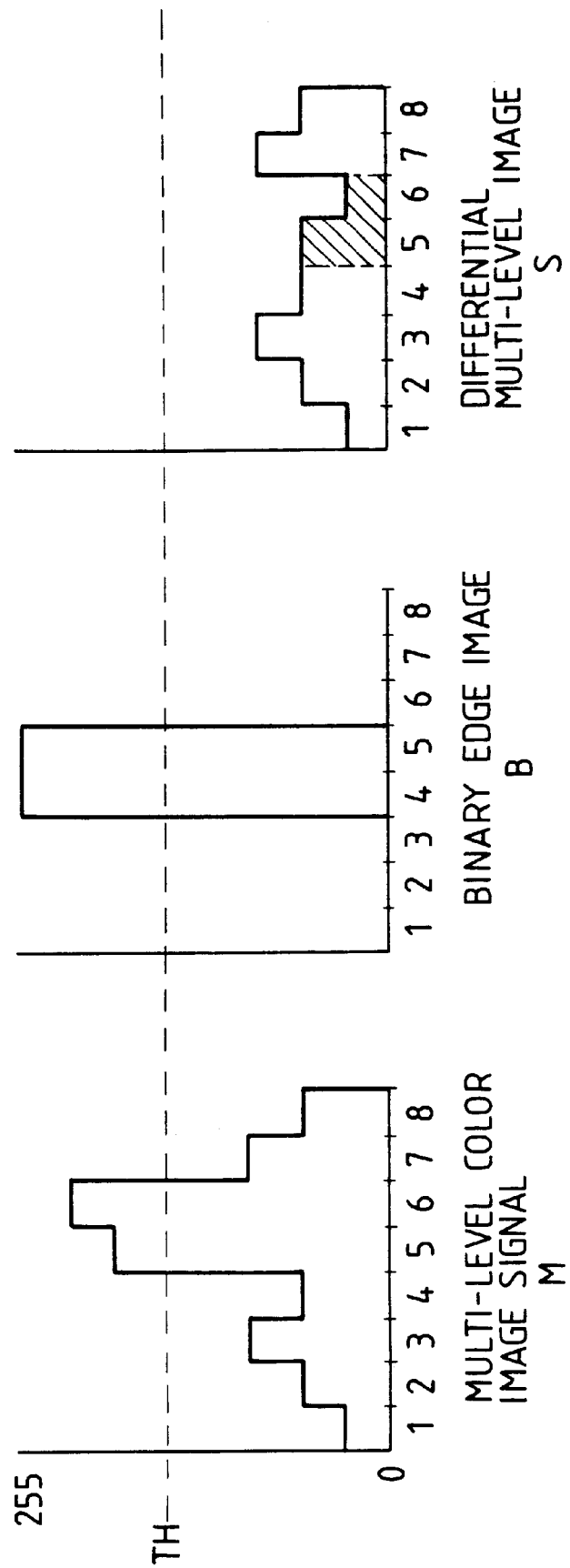

IMAGE PROCESSING APPARATUS CAPABLE OF REMOVING AN EDGE PORTION FROM A MULTI-LEVEL COLOR SIGNAL BASED ON A BINARY COLOR SIGNAL

This application is a division of application Ser. No. 08/285.523 filed on Aug. 4, 1994, U.S. Pat. No. 5,844,718, which is a continuation of application Ser. No. 07/664,868 filed on Mar. 5, 1991 now abandoned.

BACKGROUND OF THE INVENTION

1. Field of the Invention

The present invention relates to an image processing apparatus such as an encoder or decoder for a color image used on a color facsimile terminal equipment which communicates the color image or a color electronic file for storing color images.

2. Related Background Art

Conventionally, various proposals have been made for the still color image encode method. The still color images of interest can be largely classified into the following two types.

(1) Binary color image in which eight colors of red, green, blue, cyan, magenta, yellow, white, black are dealt with in the binary form.

(2) Multi-level color image in which the representation comprising, for example, 16,700,000 colors is made by grading red, green and blue each into 256 gradients.

One of the binary color image encode methods is such that the modified Huffman method, which is a variable-length encode method currently used for the facsimile terminal equipment or the like, is applied to each color. In addition, the prediction encode method in which an encode pixel is predicted from surrounding pixels has been proposed. These methods fall into a category of the reversible encoding in which data preservation is made in the encode and decode.

On the other hand, as to the multi-level color image encode method, a method has been proposed in which a 8-bit signal for each RGB is converted into a luminance signal and a color difference signal, the coefficient values to which the orthogonal conversion (discrete cosine conversion) is applied are linearly quantized, and those quantized values are encoded in variable-length. This method is performed basically in such a way that image data is reduced by leaving the low-frequency portion of spatial frequency in image and cutting away the high-frequency portion. This method is a non-reversible encode method, with a trade-off relation between the compression ratio and the degradation of image quality.

However, in the conventional example as above described, when a color document image having color photograph incorporated therein is encoded, there are problems such as (1) In the binary color method, even if the color document portion can be encoded with an increased compressibility, an image with gradients in the color photograph portion can not be efficiently encoded.

(2) In the multi-level color method, since with the compressibility being increased, the high-frequency components of image are mostly cut off, so that the quality of image at edge portions such as letters or the like is degraded, and thereby such a high compressibility of document as in the photograph portion can not be expected.

Thus, in the still color image transmitter, two types of encoders must be provided in order to encode an image with a high compressibility and a less amount of degradation.

The encode method of using multiple types of encoders has been proposed in U.S. patent application Ser. No. 631,145 and the new U.S. Patent Application filed on Feb. 5, 1991 on the basis of Japanese Patent Application Nos. 2-27658, 2-147035, 2-147036, 2-262798 and 2-262799.

On the other hand, in performing two types of encodes, encode areas may be overlapped.

For example, when a color photograph image (multi-level color image) exists in a color document image, as shown in FIG. 18, a problem arises if a multi-level color image area is encoded after the whole area is encoded with a binary color image encoder, because binary codes are redundant for the multi-level area.

SUMMARY OF THE INVENTION

In view of the foregoings, it is an object of the present invention to encode effectively not only a multi-level color image and a binary color image, but also a color image consisting of both multi-level color image and binary color image, and to provide binarization means for converting a multi-level color signal into binary form, removal means for removing edge portion from the multi-level color signal, based on a binary color signal from said binarization means, and encoder means for encoding the binary color signal from said binarization means and the multi-level color signal having edge component removed with said removal means.

Another object of the invention is to provide an encoder for encoding a color image, comprising first encode means for encoding a multi-level color signal within a multi-level color image area in the color image, second encode means for encoding a binary color signal outside the multi-level color image area in said color image, and generator means for generating an area signal indicating the position and size of the multi-level color image area in said color image.

Another object of the invention is to provide a color image encode method for encoding a multi-level color image, in which whether each block of a pre-determined size is at edge or non-edge portion is judged, a binary color image obtained by converting the multi-level color image into binary form for the blocks judged as edge portions is encoded with the first method, and the differences between the binary color image and the multi-level color image for the blocks judged as edge portions and the multi-level color image for the blocks judged as non-edge portions, are encoded with the second method.

It is another object of the invention to perform the efficient compression.

It is another object of the invention to make the circuit configuration simpler.

It is another object of the invention to provide an image processing apparatus which an operator can easily operate.

It is another object of the invention to provide an image processing apparatus having various modes.

Other objects and features of the present invention will become apparent from the following description in conjunction with the drawings and the appended claims.

BRIEF DESCRIPTION OF THE DRAWINGS

FIGS. 6A to 6C are views showing referenced pixel positions;

FIGS. 14A to 14D are views showing referenced pixel positions;

FIG. 25 is a view showing a decoding example;

FIG. 26 is a view showing an operation example of a subtracter;

DETAILED DESCRIPTION OF THE PREFERRED EMBODIMENTS

[First example]

A preferred example of the present invention will be described in the following.

Figure 1:
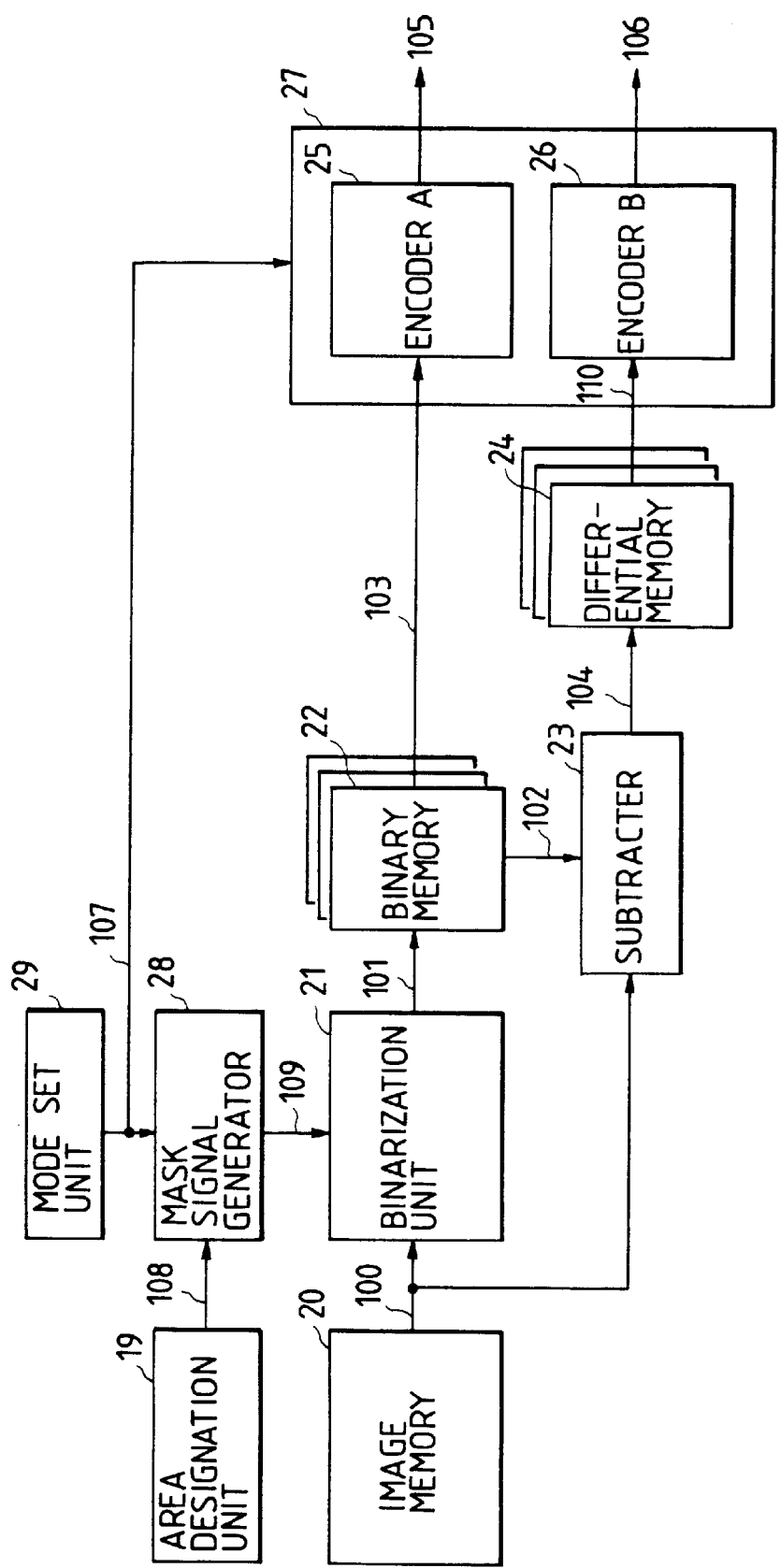
FIG. 1 is a view showing a configuration example of an encode unit to which the present invention is applied.

FIG. 1 shows a configuration example of an encoder unit wherein in image memory 20 are stored multi-level color image signals of 8 bit is each for red (R), green (G) and blue (B) representing a full-color image which was input from still color image input means such as a CCD color scanner, not shown.

Image signals 100 of each color read from the image memory 20 are subjected to the binarization processing for each color in binarization circuit 21, converted into binary color signals consisting of one bit each for R, G and B, and stored in binary memory 22 for each color. Binary color signals 103 read from the binary memory 22 are subjected to the encode processing in an encoder A for encoding binary color signals, and then codes (encoded data) 105 are output. The encode processing with this encoder A is the first encode processing.

Next, the same color image signals, which have been subjected to the first encode processing as above indicated, are read from the image memory 20. The 8-bit signals 100 for R, G and B from the image memory 20 and the signals 102 (0→0, 1→255) obtained by level converting the output from the binary memory 22 into 8-bit signals are input into subtracter 23, where the subtraction of the signals 100 from the signals 102 are performed for each color. These difference signals 104 are stored in differential memory 24 for each color. The multi-level color signals 110 in differential memory 24 are subjected to the encode processing in an encoder B for encoding multi-level color signals, whereby codes 106 are out-put. The encode processing with the encoder B as above described is the second encode processing.

Mode set unit 29 outputs a control signal 107 in accordance with an encode mode as shown in Table 5 to a mask signal generator 28 and encoders 27, to control them as indicated in the following way.

(1) In the binary mode, the binarization processing with binarization circuit 21 is performed over the entire area, and the encode processing is restricted to only the first encode processing with the encoder A 25.

(2) In the multi-level mode, the mask generator 28 generates mask signal s over t he entire area so as to disable the binarization processing with the binarization circuit 21, so that the contents in the binary memory 22 are all made zero. The encode processing is restricted to only the second encode processing with the encoder B.

Figure 15:
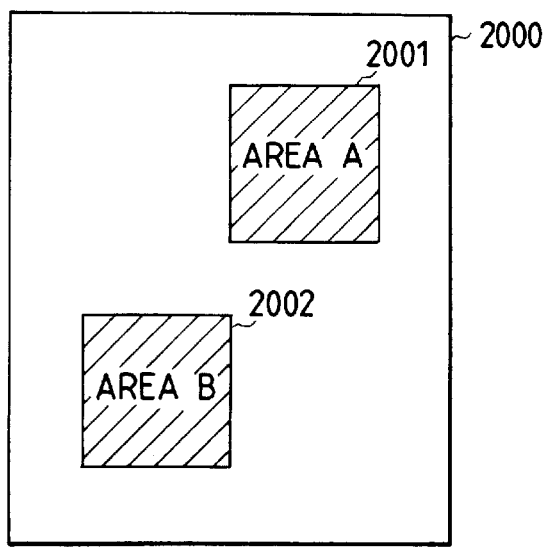
FIG. 15 is a view showing an example of area designation.

(3) In the area designation mode, the mask generator 28 generates mask signals 109 to m ask the binarization processing with the binarization circuit 21 for the multi-level color image area specified by an area designation signal 108 from an area designation unit 19 specifying the multi-level color area. FIG. 15 is a view showing a masked area in the area designation mode, in which the masks for the binarization processing are applied to an area A 2001 and an area B 2002 among the entire image area 2000.

The area destination unit 19 may output an area destination signal 108 by automatically judging the multi-level color image area by means of a color image monitor, or output the signal 108 in accord with an area designation manually input with a keyboard or digitizer.

A method of deciding the multi-level image area is accomplished by making a histogram for input color image and deciding whether or not there is data in the intermediate level.

The encode processing in the area designation mode includes the first encode processing for encoding and transmitting the contents of binary memory 22 by means of the encoder A 25 as the first stage, and the second encode processing for encoding and transmitting the contents of differential memory.

Figure 28:
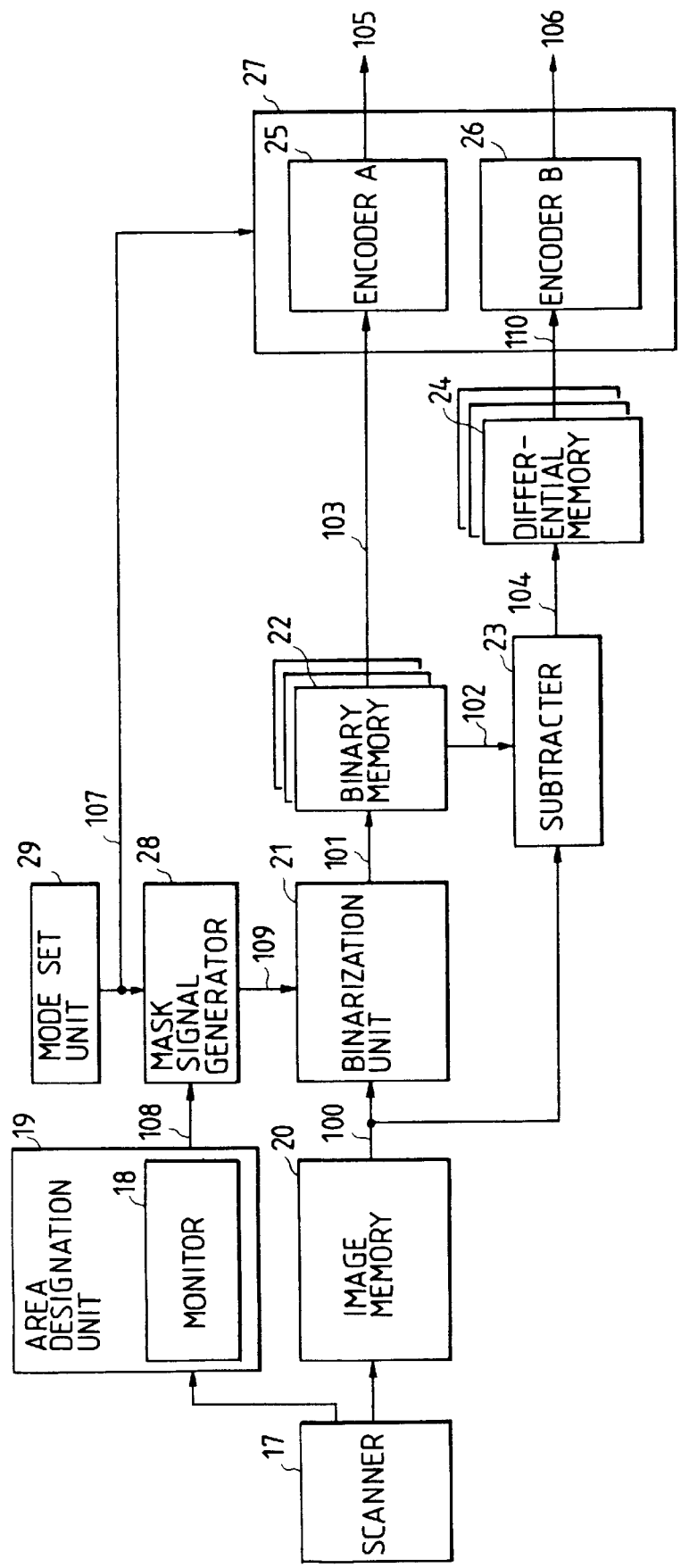
FIG. 28 is a view showing a configuration of area designation means.

As shown in FIG. 28, the area designation unit 19 may include a monitor 18. In FIG. 28, an original image read from a CCD scanner 17 that is image reading means is stored in image memory 20 and displayed on the monitor 18. Viewing the monitor image, an operator can make the above-mentioned area designation by means of a digitizer or mouse. With such monitor display, the area designation can be more easily performed.

Further, original image can be processed in such a way that in the first scanning with the CCD scanner 17, the original image is displayed on the monitor 18, and then after the area designation as above described, in the second scanning with the CCD scanner 17, image to be processed is entered. In this case, the capacity of memory 20 can be reduced with the real time processing.

(4) In the automatic mode, a binary still color image is encoded and transmitted in such a way that entire area is converted into the binary form with the binarization circuit 21, the resulting binary codes are stored in the binary memory 22, and then are subjected to the first encode processing with the encoder A 25. Next, a differential image 110, which is obtained by subtracting the original image from the level-converted image of binary image with the subtracter 23, is subjected to the second encode processing with the encoder B 25 and then transmitted.

Figure 16:
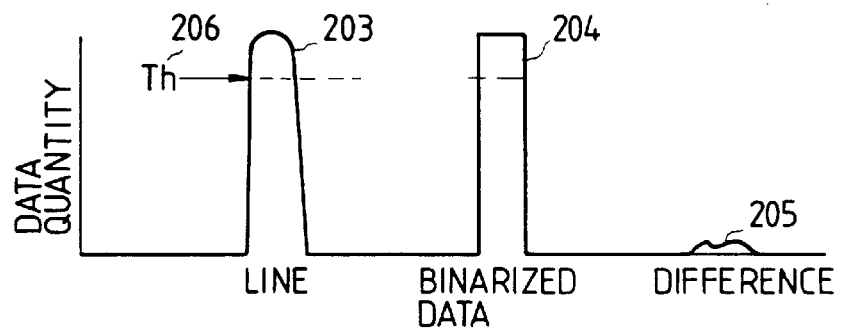
FIG. 16 is a view showing an operation example of a subtracter.

FIG. 16 shows line data 203 read from the image memory, a signal 204 obtained by converting a signal 203 into binary form with the binarization circuit 21 at a threshold Th 206 and further level-converting it, and a differential signal 205 obtained by subtracting the signal 203 from the signal 204. In this way, line signals (or edge signals) in a multi-level color image can be eliminated by the subtracter 23. Thus, since the multi-level data with edge components removed are formed and encoded, an excellent encoding can be achieved without blurs or scratches resulting from the multi-level color encoding for edge portions.

The transmission time can be reduced by transmitting only a binary color image containing a lesser quantity of data at the first stage, wherein a received image can be confirmed at the early time by decoding and displaying only signals from the first stage.

Figure 2:
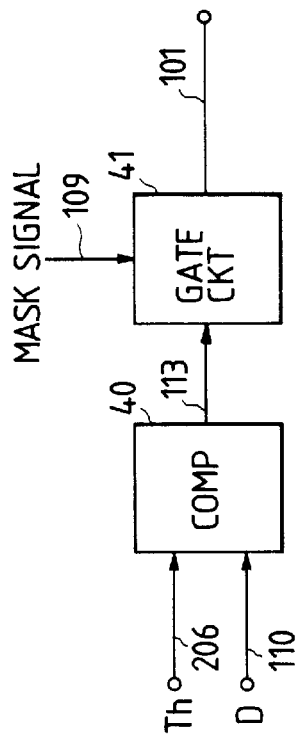
FIG. 2 is a block diagram of a binarization circuit.

FIG. 2 is a block diagram of a binarization circuit 21.

A comparator 40 compares a threshold Th 206 and an original image signal D100, and set a signal 113 at 1 if D≧Th, or otherwise, at zero. And a gate circuit 41 forces a signal 101 to be 0 if a mask signal is true, or otherwise, passes the input signal 113 with no change.

In this example, the binarization is performed simply with the comparator, but is not limited to this constitution. For example, the threshold level may be changed depending on the image quality.

In this way, if the second encoding process for multi-level color image over the entire area of screen is required, the signal 101 may be rendered zero over the entire area with the gate circuit 41, because it is possible to force the signal 101 to have a specific value, i.e., zero, with the gate circuit 41. Further, if the second encoding process for multi-level color image in a desired portion of screen is required, the signal 101 may be rendered zero for the desired portion with the gate circuit 41.

Thus, the encode processing adequate for an encode image can be arbitrarily performed by controlling the gate circuit 41 in accordance with the encode mode and the area designation.

Figure 3:
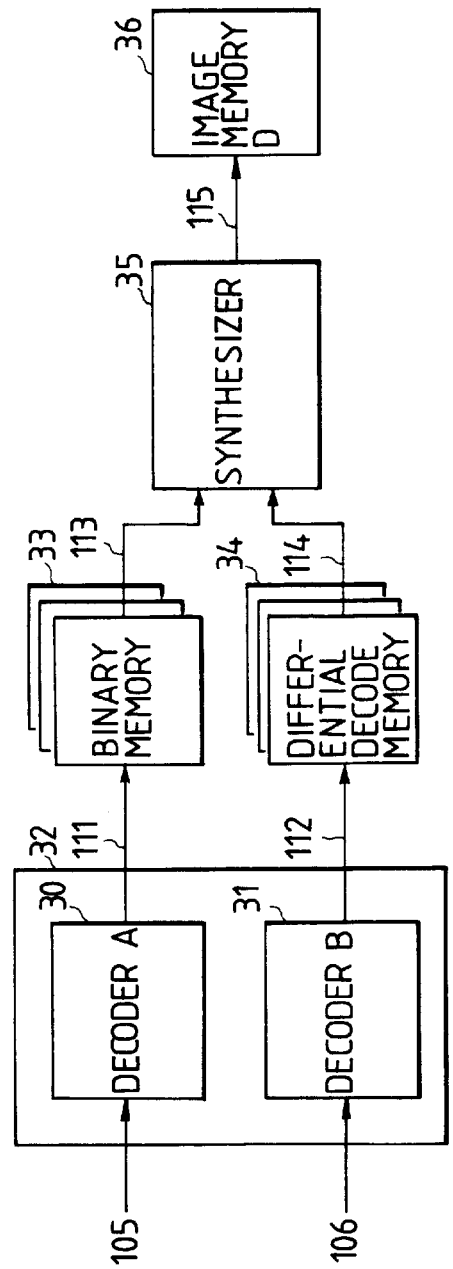
FIG. 3 is a view showing a configuration example of a decoder unit.

FIG. 3 shows a configuration example of decoder to which the present invention is applied.

Codes 105 of a binary color image are decoded with a decoder A 30 into dot images for each color, and stored in a binary memory 33. These dot images correspond to binary signals stored in the binary memory 22 as shown in FIG. 1. And codes 106 of a multi-level color image are decoded into multi-level image data for each color with a decoder B 31, and stored in a differential memory 34. The stored data in the differential memory 34 correspond to differential signals stored in the differential memory 24 as shown in FIG. 1.

Synthesizer 35 synthesizes signals obtained by level converting one-bit signals 113 for each of RGB from the binary memory 33 and the differential signals 114 from the differential memory 34, whereby signals 115 are obtained and stored in image memory D 36. The image synthesis in the synthesizer 35 is performed by the inverse processing to that of subtracter 23 as shown in FIG. 1, or in the manner that an original signal 203 is obtained by subtracting a signal 205 from a signal 204 as shown in FIG. 16.

Image data stored in the image memory D 36 are used for the monitor display or hard copy.

The hard copy can be realized with a color laser beam printer, color thermal transfer printer, color dot printer, color inkjet printer, etc.

Especially, the color inkjet printer includes a so-called bubble jet printer which is a type having discharging of liquid droplets by film boiling with the heat energy.

Also, a color image file can be utilized by providing a memory for storing encoded data 105 and 106.

Figure 4:
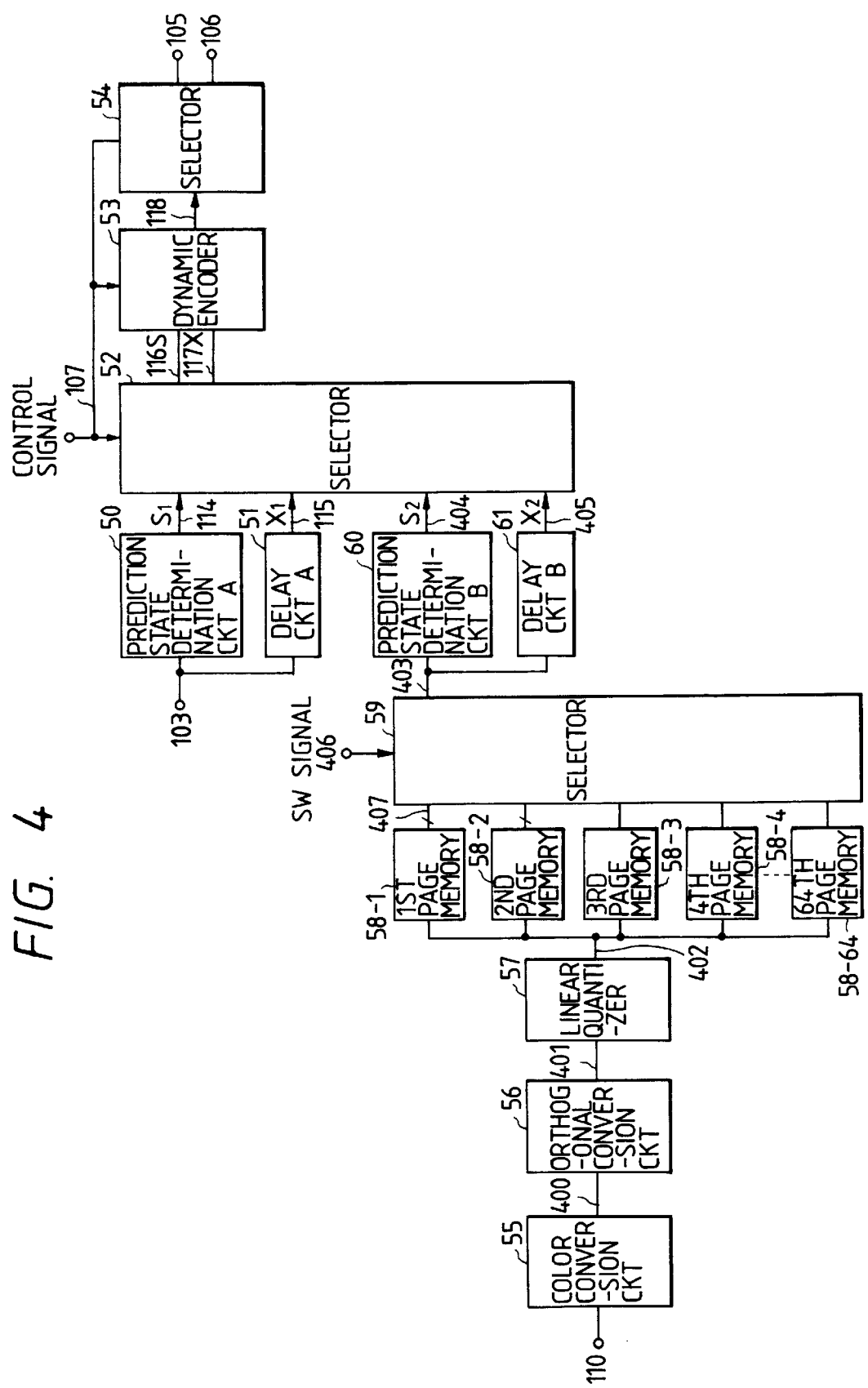
FIG. 4 is a block diagram of an encoder.

FIG. 4 is a block diagram of an encoder 27 as shown in FIG. 1.

Binary color encoder A 25 is comprised of a predication state circuit A 50 and a delay circuit A 51, and a dynamic encoder 53, and is switched between input and output operations by selectors 52, 54 operating under a control signal 107. Multi-level color encoder B 26 is comprised of a color conversion circuit 55, an orthogonal conversion circuit 56, a linear quantizer 57 and the first to 64th page memories 58-1 to 58-64, a selector 59, a prediction state determination circuit B 60, a delay circuit B 61 and a dynamic encoder 53, and is switched between input and output operations by selectors 52, 54 operating under a control signal 107 like the encoder A 25.

Here, the dynamic encoder 53 which is a central part of the encoder 27 is configured to be commonly used for the encoders A and B, whereby the hardware constitution can be simplified. The processings for the encoders A and B will be described.

First, the encoder A will be described.

Output 103 from the binary memory 22 is entered into the prediction state circuit A 50. The prediction state circuit A 50 outputs a prediction state signal $S_1$ 114 comprised of peripheral encoded pixels for a pixel of interest. The delay circuit A 51 outputs a one-bit pixel signal $X_1$ 115 in synchronization with the prediction state signal $S_1$, and then both signals $S_1$ 114 and $X_1$ 115 are entered into the selector 52.

Figure 5:
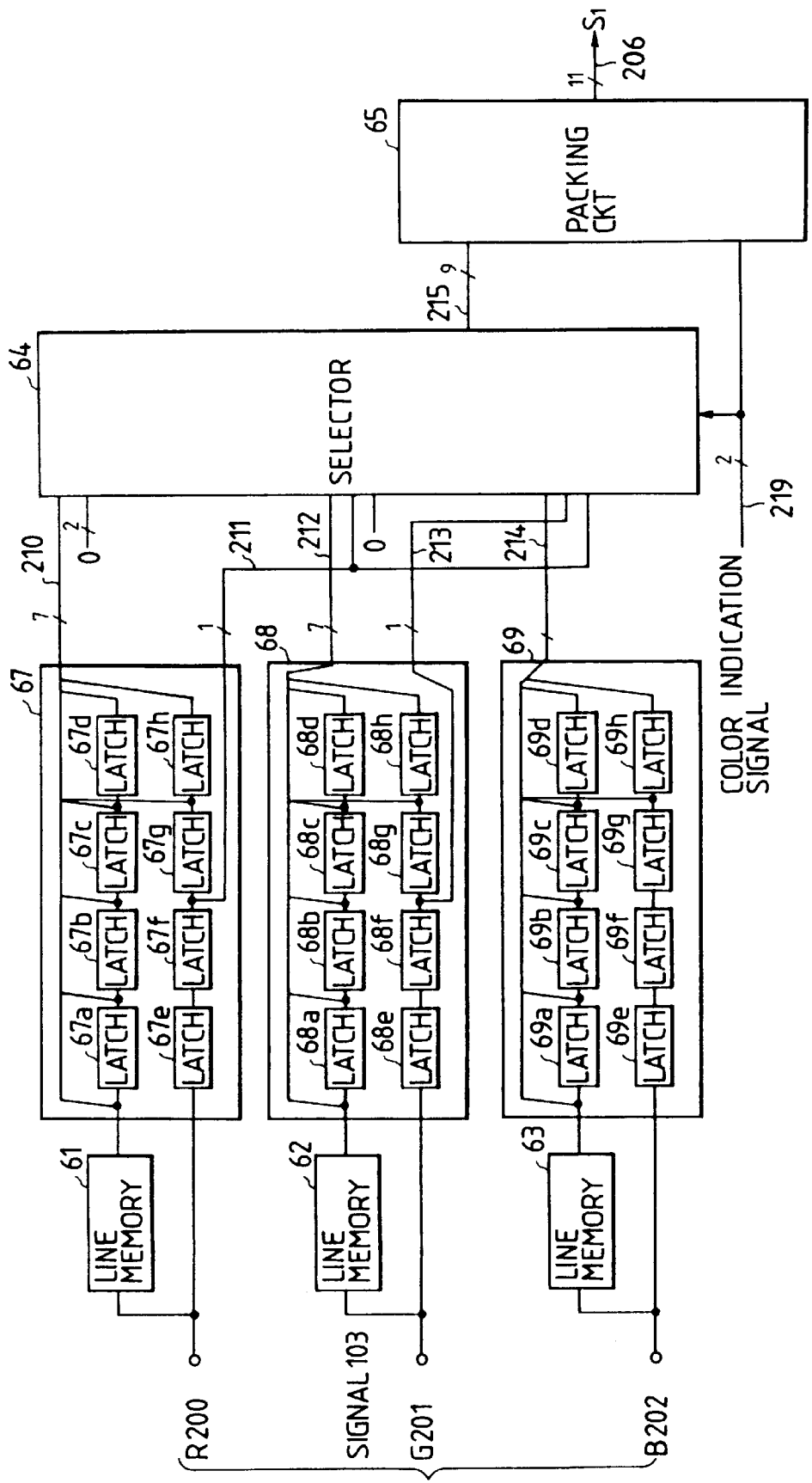
FIG. 5 is a block diagram of a prediction state determination circuit A.

FIG. 5 is a block diagram of the prediction state determination circuit A 50, and FIGS. 6A to 6C are views illustrating pixel positions to be referenced in the state prediction for each color.

That is, FIG. 6A shows reference pixels for the first encode color (R in this example), where already encoded seven pixels around a pixel to be encoded indicated by * (asterisk) are represented.

FIG. 6B shows reference pixels for the second encode color (G in this example), where eight pixels consisting of seven pixels like in FIG. 6A and a first color pixel at the same position are represented.

And FIG. 6C shows reference pixels for the third encode color (B in this example), where nine pixels consisting of seven pixels like in FIG. 6A and first and second color pixels at the same position are represented.

With the constitution as shown in FIG. 5, the state for each color can be determined by referring to a plurality of pixels at referenced pixel positions for each color as shown in FIGS. 6A to 6C. The operation of FIG. 5 will be described in the following.

A signal 103 of three bits consisting of one bit each for R, G and B is entered into a group of latches 67–69 as RGB data 200–202, and also entered into line memories 61, 62 and 63, which carry RGB data delayed by one line. Thus, the latches 67a–67h, 68a–68h and 69a–69h will carry data delayed by each one pixel clock.

Data of five pixels in a previous line of the encode line can be referenced based on the outputs from the latches 67a, 67b, 67c and 67d among a group of latches 67 into which the output of line memory 61 is entered, and the line memory 61. And two pixels already encoded in the encode line can be referenced from the outputs of latches 67g, 67h. A combination of these seven pixels data can be used as reference pixel signals for determining the state of R which is a first encode color. From the latch 67f, R data 211 which is an encoded pixel is output for determining the states for other colors G and B.

The groups of latches 68 and 69 with the same constitution as that for the group of latches 67 are provided for data G 201 and B 202, and output seven-pixel data like the group of latches 67 as reference pixel signals 212, 214, respectively.

And from the latch 68f among the group of latches 68, G data 213 which is an encoded pixel is output for determining the state for color B.

In the selector 64, the reference pixel signals are switched in accordance with a color indication signal 219 consisting of two bits for indicating the color correspondent to the output for each color data of R, G and B. That is, when the color indication signal 219 is R, the reference pixel signals 210 and a null signal of two bits are selected. When it is G, the reference pixel signals 212, an R signal 211 and a null signal of one bit are selected. And when it is B, the reference pixel signals 214, the R signal 211 and a G signal 213 are selected. The 9-bit selection signal 215 and the color indication signal 219 of two bits are packed into an eleven-bit signal by a packing circuit 65, thereby giving a state signal $S_1$ 206. Accordingly, the state signal $S_1$ indicates the color of pixel to be encoded and peripheral states, thereby enabling the $2^7$, $2^8$ and $2^9$ states for each color of R, G and B.

Next, the encoder B as shown in FIG. 4 will be described.

An image signal 110 read from the differential memory 24 as shown in FIG. 1 is converted from RGB signal to luminance and color difference signals in color conversion circuit 55. For this conversion, the following expressions are used.

Y=0.299R+0.587G+0.114B

Cr=0.713(R−Y)

Cb=0.564(B−Y)

Note that the values of R, G, B, Y, Cr and Cb are normalized.

Figure 12:
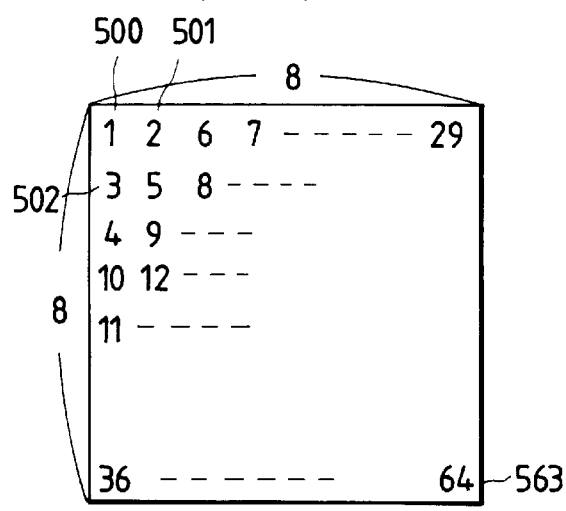
FIG. 12 is a view showing the conversion coefficients.

Next, in orthogonal conversion circuit 56, image for each block of 8×8 pixels is converted into a conversion coefficient (intensity) for each frequency, using the discrete cosine conversion. The conversion coefficient as shown in FIG. 12 is formed in a 8×8 block and the converted values are numbered from 1 to 64. The coefficient number 1 as indicated by 500 shows a component of direct current. The coefficient numbers 2, 3 . . . indicated by 501, 502, . . . show the components of alternating current, in which they are arranged from low frequency to high frequency when the number increases.

A conversion coefficient signal 401 is quantized into, for example 8 bits in linear quantizer 57. This linear quantizer 57 has predetermined steps of quantization in such a manner that the quantization step is fine for direct or low frequency and coarse for high frequency. The 64 values after quantization constituting the 8×8 block as previously described are stored in 64 page memories, i.e., first to 64th page memory, 58-1 to 58-64. That is, the quantized value for the direct current component corresponding to the coefficient number 1 in the 8×8 block is stored in the first page memory 58-1, and lastly the quantized value for the alternating current at the maximum high frequency corresponding to the coefficient number 64 in the 8×8 block is stored in the 64th page memory 58-64. Accordingly, the quantized values at same position in a plurality of 8×8 blocks constituting a screen of one page are stored in each page memory 58-1 to 58-64.

Data in the first to 64th page memory 58-1 to 58-64 are entered through the selector 59 into a prediction state determination circuit B 60 and a delay circuit B 61. The transfer method of data in page memories is such that the contents of first page memory 58-1 are all sent out, and then those of second page memory 58-2 are sent out, and so on, and lastly those of 64th page memory 58-64 are sent out. This is controlled with the selector 59 which performs the switch operation in accord with a switch signal 406 output from the central controller, not shown.

Figure 13:
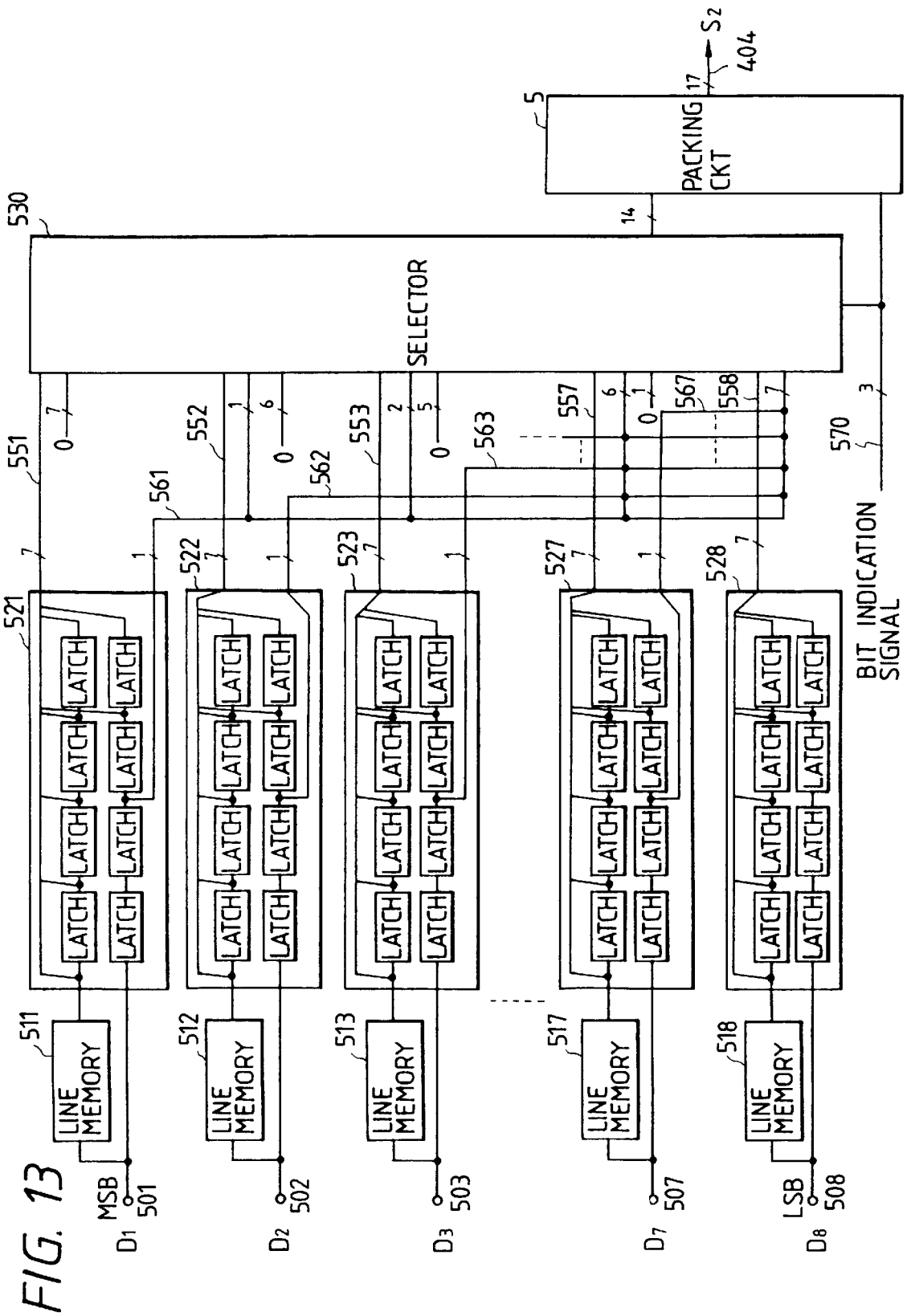
FIG. 13 is a block diagram of a prediction state determination circuit B.

FIG. 13 shows a block diagram of a prediction state determination circuit B 60. It is basically similar to the reference method as shown in FIG. 5. The encoding is started from the most significant bit plane, and the encoding for the n-th bit plane is performed by referring to already encoded pixels in the first to n-1th bit plane. And it also refers to already encoded peripheral seven bits.

FIGS. 14A to 14D show pixel positions for each bit which are referred to for the state prediction.

That is, FIG. 14A shows reference pixels for the first bit $D_1$ (MSB) in the encode, where already encoded seven pixels around an encoding pixel as indicated by * are referenced.

FIG. 14B shows reference pixels for the second bit $D_2$ in the encode, where eight pixels consisting of seven pixels like in FIG. 14A and a pixel of a first bit at the same position are referenced.

FIG. 14C shows reference pixels for the third bit $D_3$, where nine pixels consisting of seven pixels like in FIG. 14A and the pixels of first and second bits at the same position are referenced.

Figure 14D:
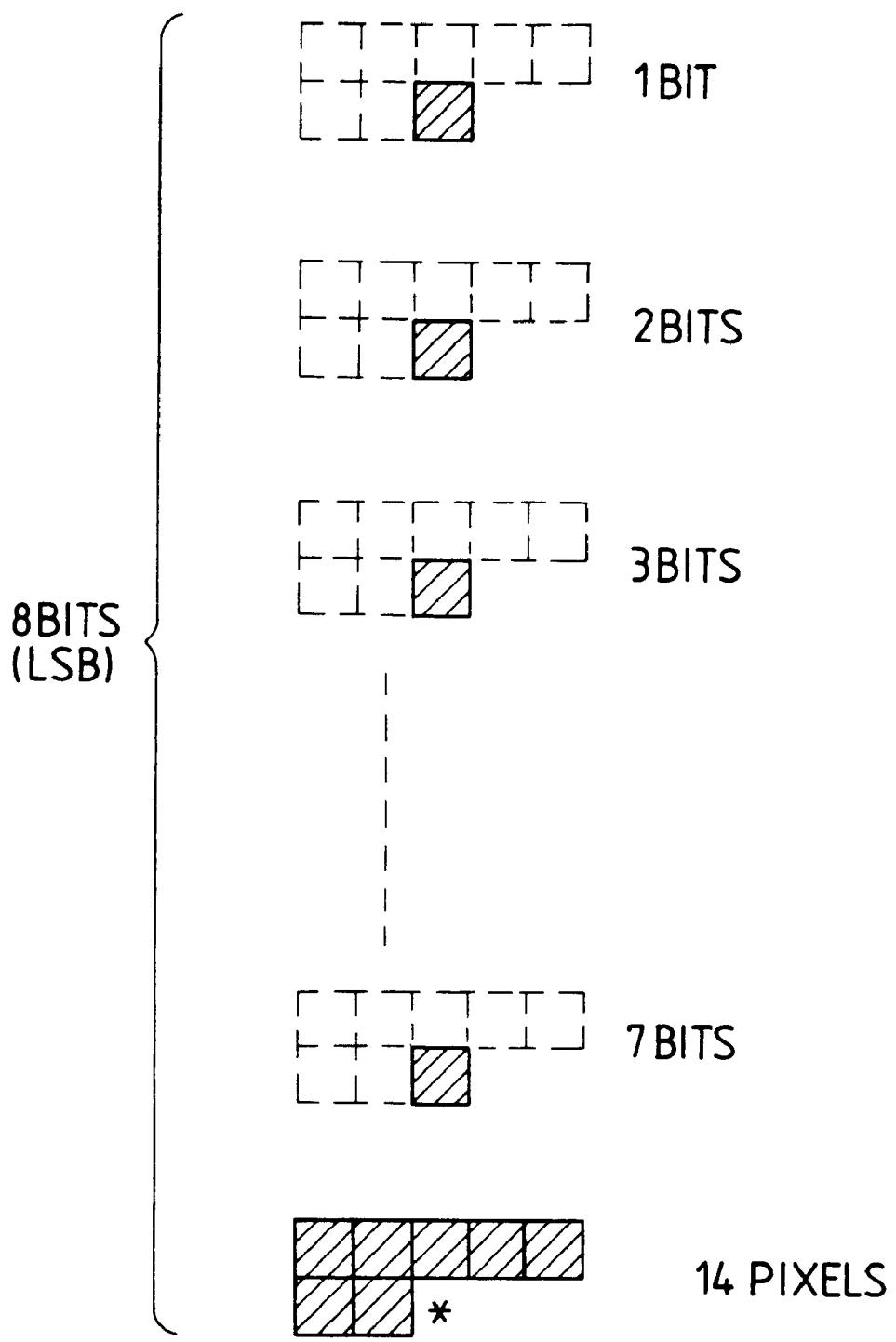

And FIG. 14D shows reference pixels for the eighth bit $D_8$ (LSB), where fourteen pixels consisting of seven pixels like in FIG. 14A and the pixels of first to seventh bits at the same position are referenced.

With the constitution as shown in FIG. 13, the state for each bit plane can be determined by referring to a plurality of pixels at reference pixel positions for each bit as shown in FIGS. 14A to 14D. The operation of FIG. 13 will be described in the following. Note that the circuits associated with fourth to sixth bits are omitted to avoid the complexity of drawing.

A signal 110 consisting of eight bits is entered into a group of latches 521–528 as bit plane data 501–508, respectively, and also entered into line memories 511–518, which carry each bit plane data delayed by one line. And the latches 521–528 will carry data delayed by each one pixel clock in the same way as for the group of latches 67–69.

Data of five pixels in a previous line of the encode line can be referenced, based on the outputs from the four latches among a group of latches 521 into which the output of line memory 511 is entered, and the line memory 511. Further, two pixels already encoded in the encode line can be referenced from the outputs of latter two latches among the four latches into which data 501 is directly entered. A combination of these seven pixels of data is a reference pixel signal 551 for determining the state of data $D_1$ which is a first encode bit. From the group of latches 521, data 561 of $D_1$ which is an encoded pixel is output for determining the states for other bit planes.

The groups of latches 522, 523–527 and 528 with the same constitution as that for the group of latches 521 are provided for data $D_2$, $D_3$–$D_7$ and $D_8$, and seven-pixel data like the group of latches 521 are output as reference pixel signals 561, 562, 563–557 and 558, respectively.

And from the group of latches 522, data 562 of $D_2$ which is an encoded pixel is output for determining the states for each bit plane of third to eighth bit.

In the selector 530, the reference pixel signals are switched in accordance with a bit indication signal 570 consisting of three bits for indicating the bit correspondent to the output for each bit plane. That is, when the bit indication signal 570 is a first bit $D_1$, the reference pixel signal 551 and a null signal of seven bits are selected. When it is a second bit $D_2$, the reference pixel signal 552, $D_1$ signal 561 and a null signal of six bits are selected. And when it is an eighth bit $D_8$, the reference pixel signal 558, $D_1$ signal 561, $D_2$ signal 562, $D_3$ signal 563 to $D_7$ signal 567 are selected. The 14-bit selection signal 215 and the bit indication signal 219 of three bits are packed into a seventeen-bit signal by a packing circuit 540, thereby giving a state signal $S_2$ 404. Accordingly, the state signal $S_2$ indicates the bit plane of pixel to be encoded and peripheral states.

The output signal $S_2$ 404 is entered into the selector 52 as shown in FIG. 4. Delay circuit B61 serves to synchronize an output signal $X_2$ 405 with a reference signal $S_2$.

Signals S 116 and X 117 are selected from the above-mentioned signals $S_1$, $X_1$ and $S_2$, $X_2$ by the selector 52 operating under a control signal 107 which is output from the central controller, not shown. Further, these signals are encoded with a dynamic encoder 53, with a signal 118 being switched in selector 54 operating under the control signal 107, whereby codes 106 are output.

Figure 7:
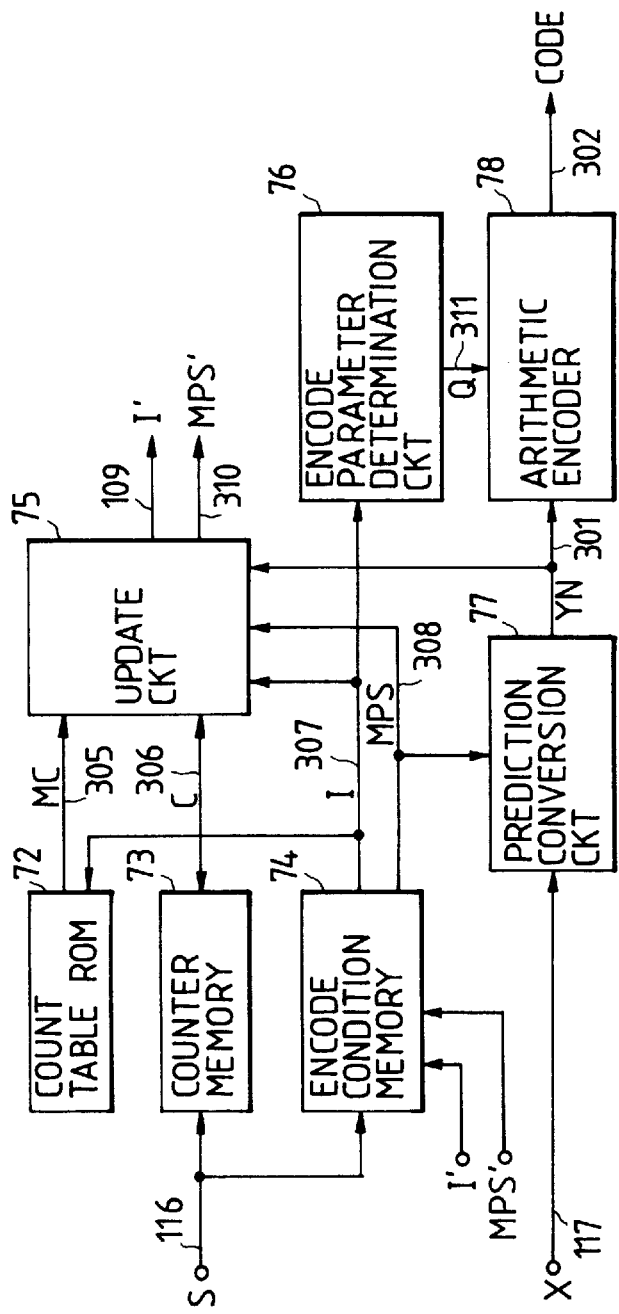
FIG. 7 is a block diagram of a dynamic encoder.

FIG. 7 is a block diagram of dynamic encoder 53 as shown in FIG. 4.

Before explanation of FIG. 7, the arithmetic code used in this example will be described.

As conventionally well known, the arithmetic coding is a method in which a code is formed with the arithmetic operation to transform a sequence of input signals into the code expressed as a binary coded decimal. This method was published in, e.g., a book by Langdon and Rissanen entitled "Compression of Black/White Images With Arithmetic Coding", IEEE Tran Com. COM-29, 6, (1981.6). According to this book, assuming that a sequence of already encoded input signals is S, the probability that a least possible symbol (LPS) will occur is q, an operation register Augend is A(S), and a code register is C(S), the following operation will be performed for each input signal.

$$A(S1) = A(S) \times q \qquad (1)$$
$$\simeq A(S) \times 2^{-Q}$$
$$A(S0) = <A(S) - A(S1)>_l \qquad (2)$$

$<>_l$ indicates the truncation at significant digits of 1 bits.

$$C(S0) = C(S) \qquad (3)$$
$$C(S1) = C(S) + A(S0) \qquad (4)$$

Here, if encode data is a most possible symbol (MPS: 0 in above example), A(S0) and C(S0) are used for the encoding of next data. If it is a least possible symbol (LPS: 1 in above example), A(S1) and C(S1) are used for the encoding of next data.

The value of a new A is increased by $2^S$ times (S is an integer not less than zero), and retained in the range $0.5 \leq A < 1.0$. This processing corresponds to S shifts of arithmetic register A in the hardware. The same number of shifts are also performed for the code register C, with a shifted out signal being used as a code. By repeating the above processing, the formation of code is performed.

As indicated in the expression (1), the multiplication operation is replaced with the shift operation, by approximating the occurrence probability q of LPS with the amount 2 to the power Q ($2^{-Q}$:Q is a positive integer). To make this approximation better, q is approximated with, for example, a polynomial consisting of the sum of two terms each of which is the amount 2 raised to an integral power as shown in expression (5). With this approximation, a most inefficient operation can be improved.

$$q \approx 2^{-Q1} + 2^{-Q2} \qquad (5)$$

As the arithmetic code allows the value of Q to be changed for each code data, the probability estimation unit can be separated from the encode.

In this example, a dynamic method is adopted in which the probability is estimated while performing the encode.

A block diagram for an encoder 53 of FIG. 7 which performs the above arithmetic encode will be described.

A state signal S 116 from the selector 52 as shown in FIG. 4 is entered into a counter memory 73 and an encode condition memory 74.

In the encode condition memory 74 is stored a most possible symbol MPS 308 which is likely to occur, and an index I 307 for indicating the encode condition including an occurrence probability of LPS for the arithmetic code as will be described later for each state indicated by the state signal S116. MPS 308 read from the encode condition memory 74 in accordance with the color and state of image to be encoded is entered into a prediction coversion circuit 77, which creates a YN signal 301, where it becomes zero when a serial image signal X 117 from the selector 52 as shown in FIG. 4 coincides with MPS 308. The YN signal 301 is entered into an update circuit 75, which increments the count of corresponding state among the count value stored in the counter memory 73 when the YN signal is zero. And if the count value C 306 stored in the counter memory 73 coincides with a set value MC 305 from the count table ROM 72, it is updated in the direction where the index I 307 increases (or the occurrence probability of LPS decreases). (No inversion of MPS is made).

The count table ROM 72 supplies to the update circuit 75 a numeral MC 305 of the MPS shown in Table 1, which numeral is determined in correspondence with the index I representing the occurrence probability q of LPS.

Further, in the update circuit 75, if MPS 308 does not coincide with a pixel signal X 117, or the YN signal from the prediction conversion circuit 77 is 1, it is updated in the direction where the index I 307 decreases (or the occurrence probability of LPS increases). Further, if a YN signal having the value of 0 arrives when the index is 1, the inversion of MPS ($0 \rightarrow 1$ or $1 \rightarrow 0$) is performed. Outputs I' 309, MPS' 310 from the update circuit 75 are index values after update, and restored in the encode condition memory 74.

Encode parameter determination circuit 76 sets an encode parameter Q 311 of the arithmetic code to an arithmetic encoder 78, based on values of index I 307. The arithmetic encoder 78 performs the arithmetic encode of the YN signal 301 from prediction conversion circuit 77 by using the parameter Q 311, whereby codes 302 are obtained.

It should be noted that the static encode can be easily implemented by transferring initial values to the encode condition memory 74, and not updating I and MPS.

Figure 8:
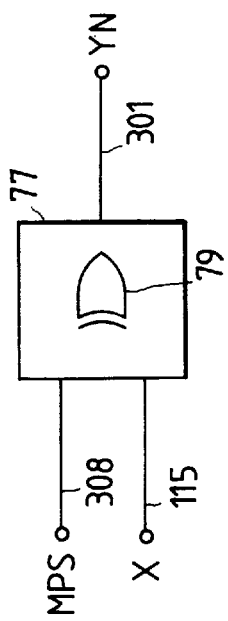
FIG. 8 is a block diagram of a prediction conversion circuit.

FIG. 8 is a block diagram of prediction conversion circuit 77. A serial pixel signal X 117 and MPS 308 are entered into an EX-OR circuit 79, where a YN signal 301, which is 0 if a serial pixel signal X 115 and MPS 308 coincide, or otherwise 1, is output.

Figure 9:
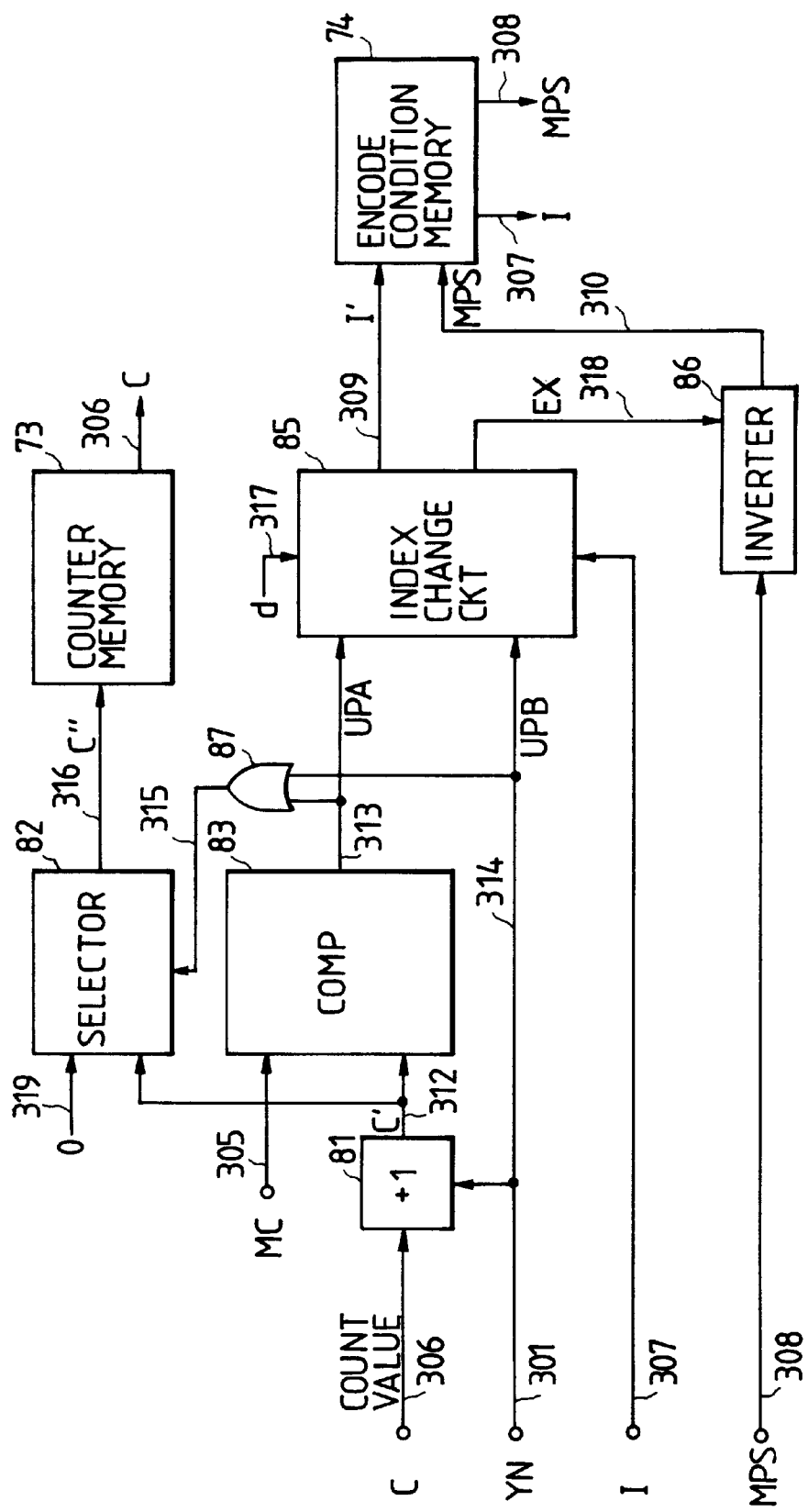
FIG. 9 is a block diagram of an update circuit.

FIG. 9 is a block diagram of update circuit 75. When the YN signal 301 is zero, the count value C 306 from the counter memory 73 is incremented by +1 with an adder 81, whereby a signal C' 312 is obtained. This value is compared with an MC 305 from the count table ROM 72, where if the value of C' coincides with that of MC, the update signal UPA 313 is set at 1. The YN signal 301 becomes an update signal UPB 314, and UPA and UPB are entered into an index change circuit 85. Further, UPA and UPB are ORed logically in the OR circuit 87, and an output signal from the OR circuit 87 becomes a switch signal for the selector 82. The selector 82 selects a 0 signal 319 to reset the value of counter memory 73 if a signal 315 is 1, or otherwise, selects an output signal C' 312 of adder 81, and outputs a counter update signal C" 316, which is stored in the counter memory 73. Accordingly, when the serial pixel signal X 115 and MPS 308 do not coincide, or when the coincident conditions consecutively occur by the predetermined times, the count value of the counter memory 73 is reset.

Index change circuit 85 has inputs of UPA 313, UPB 314, and a current index I 307 from the encode condition memory 74, as well as a signal d 317 (normally d=1) for controlling the index update step.

Table 3 is a table showing the way of updating the index in the index update circuit 85 (Table 3 shows where the update step is d=1 and d=2). Update index I' is determined by referring to this Table with a current index I, the update step condition d, UPA and UPB. Further, when I=1 and UPB=1 (or when the serial pixel signal X 115 and MPS 308 do not coincide), an EX signal 318 is set. If the EX signal 318 is 1, an inverter 86 inverts the symbol of current MPS 308 ($0 \to 1$ or $1 \to 0$) to obtain an updated MPS' 310. And if the EX signal is 0, MPS' is not changed. Updated I' 309 and MPS' 310 are stored in the encode condition memory 74, and used as an index I and MPS for the next processing. It should be noted that the update method as shown in Table 3 can be constructed by a table in ROM, or the logics using an adder-subtracter.

As above described, if there occurs a partial quantity of MPS which is determined in accordance with the index I representing the occurrence probability q of LPS, which is approximated with a polynomial consisting of the sum of the amount 2 raised to an integral power, the index I is added by d to decrease the occurrence probability q of LPS used for the arithmetic code, while there occurs LPS, the index I is subtracted by d to increase the occurrence probability q of LPS used for the arithmetic code. Further, if there occurs LPS in a state where the occurrence probability q of LPS indicates 0.5 (or the index I is 1), MPS is inverted.

Thus, the arithmetic encode with an excellent efficiency can be accomplished by updating the index I and MPS to be adaptable to an input image.

Figure 10:
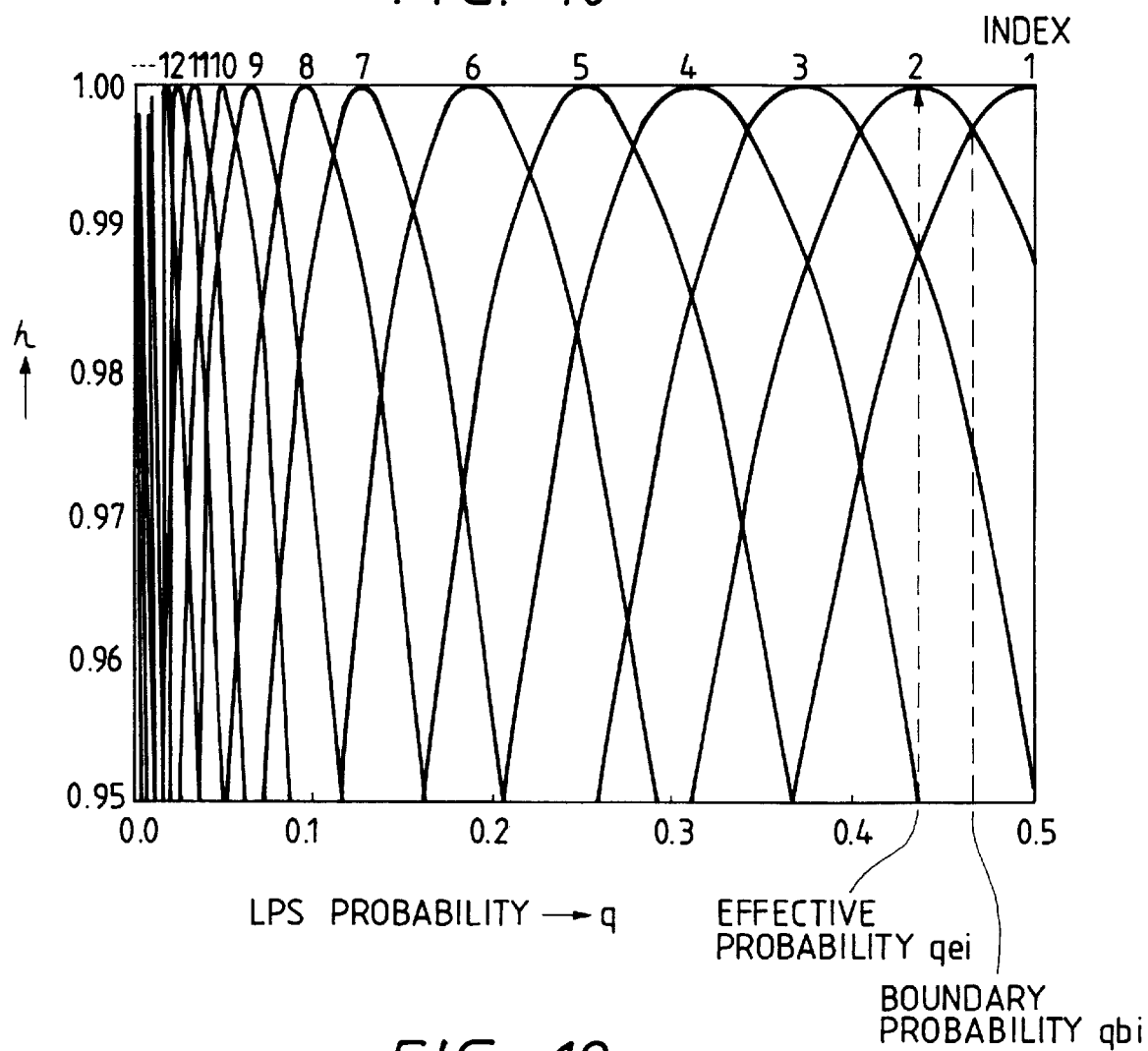
FIG. 10 is a view showing a encode efficiency curve.

FIG. 10 is an encode efficiency curve for the arithmetic code use in this example. Thereafter, the value of index I will be designated with a small letter i. This curve is represented by an expression (6), assuming that the occurrence probability of LPS is q, and the approximate probability at the encode is $q_{ei}$. And the index I is sequentially numbered as 1, 2, 3, . . . in the direction where the occurrence probability q of LPS decreases.

$$\eta=\{-q\log_2 q-(1-q)\log_2(1q)\}\{-q\log_2 q_{ei}-(1-q)\log_2(1-q)\} \quad (6)$$

where the numerator indicates the entropy, and $q_{ei}$ is a value as given by the expression (7).

$$q_{ei}=q_1+q_2 \quad (7)$$

$q_1$, $q_2$ are values in the polynomial consisting of the sum of the amount 2 raised to an integral power, which are given by Table 4. For example, they can be given by expressions (8) to (10).

$$q_{e1}'=2^{-1} \quad (8)$$

$$q_{e2}'=2^{-1}-2^{-4} \quad (9)$$

$$q^{e3'}=2^{-2}+2^{-3} \quad (10)$$

At this probability, $q_{ei}$ when the efficiency $\eta$ is 1.0, i.e., a peak point, is thereafter referred to as an effective probability. An intersection of the efficiency curve is referred to as a boundary probability $q_{bi}$, and it is clear that the efficiency can be further increased if the adjacent effective probability is used for calculation beyond the boundary probability.

In this example, the effective probability q is chosen, as shown in Table 4based on two terms approximating the probability as shown in the expression (5). Where $Q_1$, $Q_2$ and $Q_3$ are parameters $Q_c$ 311 to be transferred to the arithmetic encoder 78. That is, $Q_1$, $Q_2$ are the quantity of shifts to be given to the shift register, and the calculation of the amount 2 to an integral power is conducted with this shift operation. $Q_3$ indicates a coefficient of the second term, with which plus or minus is switched.

Values of MC as shown in Table 1 are determined as described below.

Assuming that the number of LPS is $N_L$ and the number of MPS is $N_M$, the occurrence probability of LPS is given by expression (11).

$$q=N_L/(N_M+N_L) \quad (11)$$

By transformation $N_M$ is represented by expression (12).

$$N_M=\lfloor N_L(1/q-1) \rfloor \quad (12)$$

Where $\lfloor x \rfloor$ indicates the round-up for decimal fractions. Substituting $q_{bi}$ as shown in FIG. 10 for q in expression (12), the number of most possible symbol (MPS), $N_{Mi}$, is calculated. Therefore, MC can be calculated using expression (13).

$$MCi=N_{Mi+1}-N_{Mi} \quad (13)$$

Values of MC as indicated in Table 1 were calculated f rom expressions (11), (12) and (13), with $N_L=2$.

In this way, the number of most possible symbols (MPS), n corresponding to each index I is obtained based on each boundary probability $q_{bi}$ as shown in FIG. 10, and the difference between the number of most possible symbols $N_M$ and that of adjacent index is made MC for each index.

Further, the value of MC and the number of most possible symbols MPS that occur are compared as previously described, and if they coincide, the index I is changed by judging that the state is more appropriate for the encode with an adjacent index I. Thereby, the index I can be changed at adequate timings, based on the occurrence number of most possible symbols MPS, and the encode can be accomplished adaptively by using the optimal indexes I.

Figure 11:
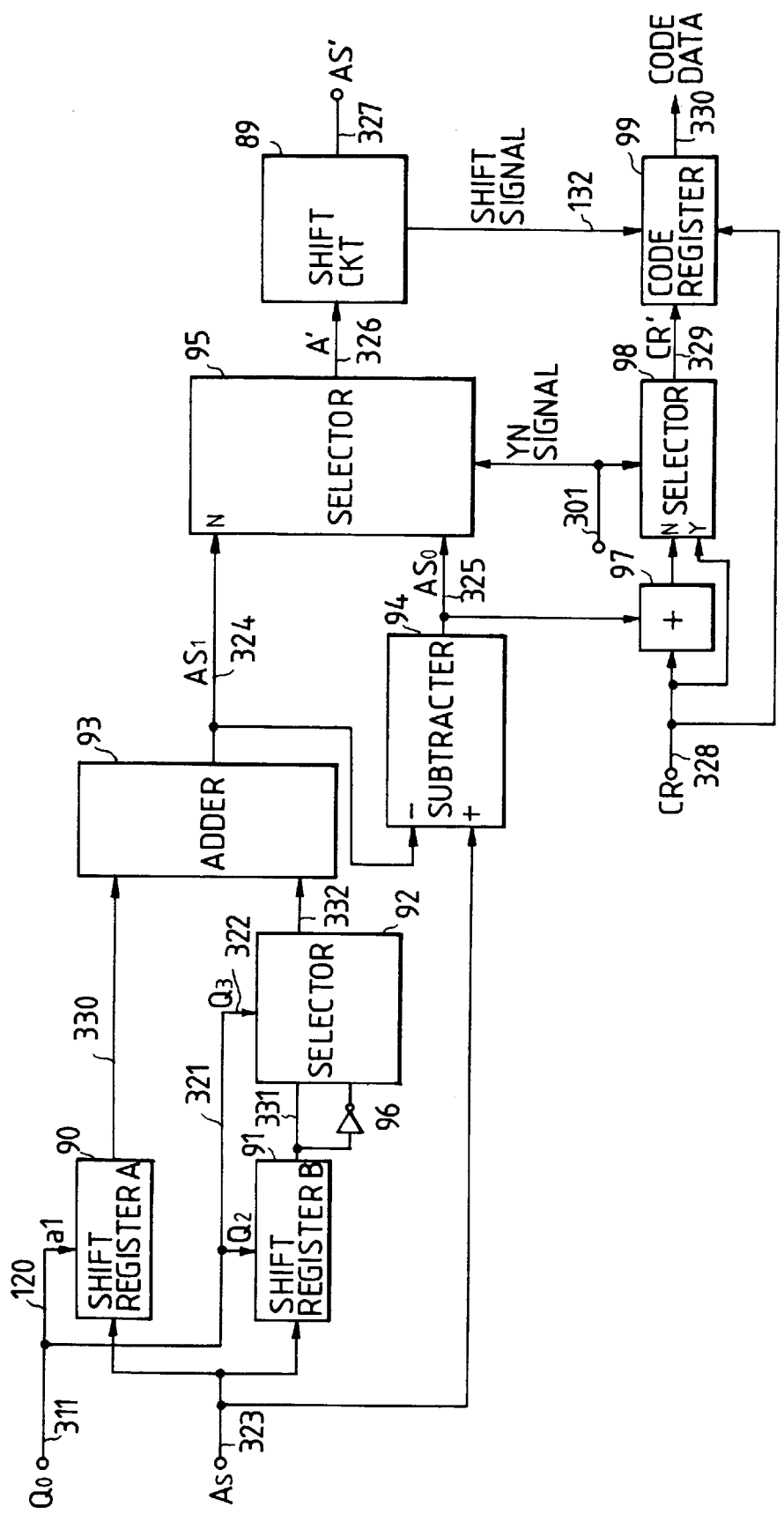
FIG. 11 is a block diagram of an arithmetic encoder.

FIG. 11 is a block diagram of arithmetic encoder 78.

For a control signal Q 311 (Table 4) determined by an encode parameter determination circuit 76, $Q_1$, $Q_2$ an d $Q_3$ are entered into a shift register A 90, a shift register B 91 and a selector 92, respectively. $Q_1$ and $Q_2$ indicates how many bits the Augend signal $A_S$ 323 is shifted to the right in the shift registers A and B, respectively. Shifted results are output signals 330, 331.

A signal 331 is subjected to the complement operation by an inverter 96, and the selector 92 selects the signal 331 or an output signal of the inverter 96, depending on a control signal $Q_3$, whereby an output signal 332 is obtained. Adder 93 adds the signal 330 from the shift register A 90 and the signal 332 from the selector 92, and outputs an $A_{s1}$ signal 324. Subtracter 94 subtracts the $A_{s1}$ signal 324 from the $A_s$ signal 323, whereby an $A_{s0}$ signal 325 is output. Selector 95 selects either the $A_{s0}$ signal 325 or the $A_{s1}$ signal 325, depending on a YN signal 301. That is, the A' signal 326 is $A_{s0}$ signal if the YN signal is 1, or $A_{s1}$ signal if it is 0. A shift circuit 89 shifts the A' signal to the left until its MSB becomes 1, whereby an A' signal 327 is obtained. A shift signal 332 correspondent to the number of shifts is entered into a code register 99, which sequentially outputs bits corresponding to the number of shifts, beginning with MSB, whereby a code data 330 is obtained.

The code data 330 is processed with the bit processing method, not shown, so that the sequence of bit 1 is within a limited number, and transmitted to a decoder 14.

The content of CR 328 in code register 99 is added with the $A_{s0}$ signal 325 by the adder 97, and then entered into selector 98. A signal CR 328 to which the $A_{s0}$ signal 325 is not added is also entered into the selector 98, where a CR' signal 329 is output in such a way that CR'=CR if YN signal 301 is 1, and CR'=CR+$A_{s0}$ if YN signal is 0. The shift operation as previously described with the code register 99 is also performed for the CR' signal.

[Second example]

In the above-described example, a binary color image which is converted into binary form from an original color image, and a multi-level color image which is obtained as the difference between the binary color image and the original color image are obtained, and then the binary and multi-level color images are encoded, respectively, for transmission. That is, the multi-level color image without edge information can be encoded for transmission by constructing the multi-level color image as the difference between binary color image and original color image, so that the excellent encode for transmission of the multi-level color image and its decode are enabled.

The formation of multi-level color information without edge portion can be accomplished with a method of masking an original color information with a binary color information, instead of the method of using the difference therebetween.

Figure 17:
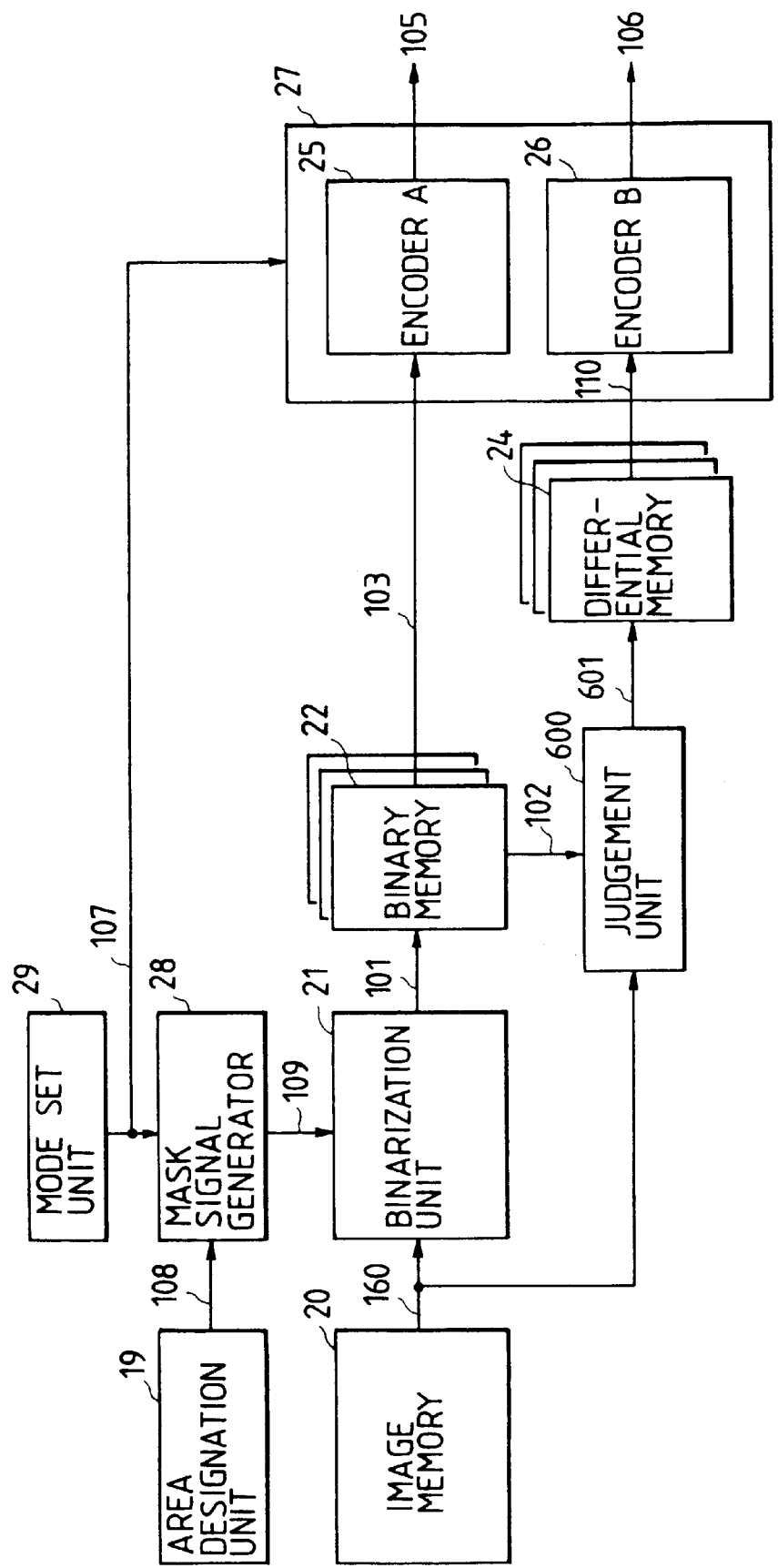
FIG. 17 is a view showing another example of an encoder unit.

FIG. 17 is an example of an encoder unit with the method of masking. Note that same reference numbers are attached to blocks having the same functions as for the encoder unit in FIG. 1.

In image memory 20 is stored color image signals of 8 bits for each of red (R), green (G) and blue (B) which represent a full-color image that was input from still color image input means, not shown.

Image signals 100 of each color read from the image memory 20 are subjected to the binarization processing for each color in binarization circuit 21, converted into binary color signals consisting of one bit each for R, G and B, and stored in binary memory 22 for each color. Binary color signals 103 read from the binary memory 22 are subjected to the encode processing in an encoder A for encoding binary color signals, whereby codes 105 are output.

Next, the same color image signals as previously described are read from the image memory 20. The 8-bit signals 100 for R, G and B from the image memory and the output from the binary memory 22 are entered into a judgment unit 600. The judgment unit 600 masks the signals from the image memory 20 with the output of the binary memory 22 over a period of one level. output signals 601 of the judgment unit 600 are stored in a differential memory 24. Multi-level color signals 110 in the differential memory 24 are subjected to the encode processing in an encoder B 26 for encoding multi-level color signals, as previously described, whereby codes 106 are output.

Figure 18:
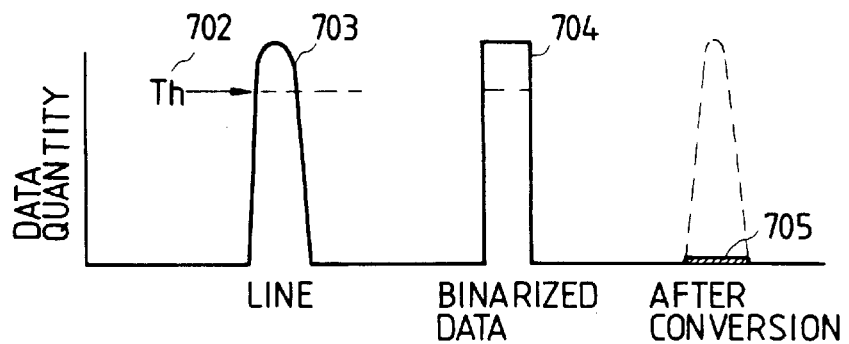
FIG. 18 is a view showing an operation example of a judgment unit.

FIG. 18 shows a signal 704 obtained by converting a line data 703 read from the image memory 20 into binary form at a threshold Th 702 and further level-converting it, and a converted signal 705 obtained by masking the signal 703 with the signal 704. In this way, line signals (or edge signals) which are high-frequency components in the multi-level color image can be removed. Thus, the encode processing can eliminate blurs or scratches resulting from edge components contained in the multi-level color image.

As shown in the above example, the circuit configuration can be simplified because a dynamic encoder 53 is commonly used for the encoders A 25 and B 26.

TABLE 1

| I | MC |
|---|-----|
| 1 | 2 |
| 2 | 1 |
| 3 | 1 |
| 4 | 1 |
| 5 | 2 |
| 6 | 4 |
| 7 | 5 |
| 8 | 8 |
| 9 | 11 |
| 10 | 15 |
| 11 | 22 |
| 12 | 30 |
| 13 | 43 |
| 14 | 61 |
| 15 | 87 |
| 16 | 120 |
| 17 | 174 |
| 18 | 241 |
| 19 | 348 |
| 20 | 483 |

TABLE 2

| D | MPS | YN |
|---|-----|-----|
| 0 | 0 | 0 |
| 0 | 1 | 1 |
| 1 | 0 | 1 |
| 1 | 1 | 0 |

TABLE 3

| | d = 1 | | | d = 2 | | |
|---|---|---|---|---|---|---|
| | UPA = UPB = 0 | UPA = 1 | UPB = 1 | | UPA = 1 | UPB = 1 |
| I | I' | I' | I' | EX | I' | I' | EX |
| 1 | 1 | 2 | 1 | 1 | 3 | 1 | 1 |
| 2 | 2 | 3 | 1 | 0 | — | — | — |
| 3 | 3 | 4 | 2 | 0 | 5 | 1 | 0 |
| 4 | 4 | 5 | 3 | 0 | — | — | — |
| 5 | 5 | 6 | 4 | 0 | 7 | 3 | 0 |
| 6 | 6 | 7 | 5 | 0 | — | — | — |
| 7 | 7 | 8 | 6 | 0 | 9 | 5 | 0 |
| 8 | 8 | 9 | 7 | 0 | — | — | — |
| 9 | 9 | 10 | 8 | 0 | 11 | 7 | 0 |
| 10 | 10 | 11 | 9 | 0 | — | — | — |
| 11 | 11 | 12 | 10 | 0 | 13 | 9 | 0 |
| 12 | 12 | 13 | 11 | 0 | — | — | — |
| 13 | 13 | 14 | 12 | 0 | 15 | 11 | 0 |
| 14 | 14 | 15 | 13 | 0 | — | — | — |
| 15 | 15 | 16 | 14 | 0 | 17 | 13 | 0 |
| 16 | 16 | 17 | 15 | 0 | — | — | — |
| 17 | 17 | 18 | 16 | 0 | 19 | 15 | 0 |
| 18 | 18 | 19 | 17 | 0 | — | — | — |
| 19 | 19 | 20 | 18 | 0 | 21 | 17 | 0 |

TABLE 3-continued

|  | UPA = UPB = 0 | d = 1 | | | d = 2 | | |
|---|---|---|---|---|---|---|---|
|  |  | UPA = 1 | UPB = 1 | | UPA = 1 | UPB = 1 | |
| I | I' | I' | I' | EX | I' | I' | EX |
| 20 | 20 | 21 | 19 | 0 | — | — | — |
| 21 | 21 | 21 | 20 | 0 | 21 | 19 | 0 |

(—): don't care.

TABLE 4

| Effective probability | | Coefficient | | Encode parameter | | |
|---|---|---|---|---|---|---|
| I | $q_e$ | $q_1$ | $q_2$ | $Q_1$ | $Q_2$ | $Q_3$ |
| 1 | 0.5000 | $2^{-2}$ | $2^{-2}$ | 2 | 2 | + |
| 2 | 0.4375 | $2^{-1}$ | $-2^{-4}$ | -1 | 4 | - |
| 3 | 0.3750 | $2^{-2}$ | $2^{-3}$ | 2 | 3 | + |
| 4 | 0.3125 | $2^{-2}$ | $2^{-4}$ | 2 | 4 | + |
| 5 | 0.2500 | $2^{-3}$ | $2^{-3}$ | 3 | 3 | + |
| 6 | 0.1875 | $2^{-3}$ | $2^{-4}$ | 3 | 4 | + |
| 7 | 0.1250 | $2^{-4}$ | $2^{-4}$ | 4 | 4 | + |
| 8 | 0.0938 | $2^{-4}$ | $2^{-5}$ | 4 | 5 | + |
| 9 | 0.0625 | $2^{-5}$ | $2^{-5}$ | 5 | 5 | + |
| 10 | 0.0469 | $2^{-5}$ | $2^{-6}$ | 5 | 6 | + |
| 11 | 0.0313 | $2^{-6}$ | $2^{-6}$ | 6 | 6 | + |
| 12 | 0.0234 | $2^{-6}$ | $2^{-7}$ | 6 | 7 | + |
| 13 | 0.0156 | $2^{-7}$ | $2^{-7}$ | 7 | 7 | + |
| 14 | 0.0117 | $2^{-7}$ | $2^{-8}$ | 7 | 8 | + |
| 15 | 0.0078 | $2^{-8}$ | $2^{-8}$ | 8 | 8 | + |
| 16 | 0.0059 | $2^{-8}$ | $2^{-9}$ | 8 | 9 | + |
| 17 | 0.0039 | $2^{-9}$ | $2^{-9}$ | 9 | 9 | + |
| 18 | 0.0029 | $2^{-9}$ | $2^{-10}$ | 9 | 10 | + |
| 19 | 0.0020 | $2^{-10}$ | $2^{-10}$ | 10 | 10 | + |
| 20 | 0.0015 | $2^{-10}$ | $2^{-11}$ | 10 | 11 | + |
| 21 | 0.0010 | $2^{-11}$ | $2^{-11}$ | 11 | 11 | + |

TABLE 5

| Encode mode | Binarization process | Encode process |
|---|---|---|
| Binary mode | Binarization over entire area | Encode only binary images |
| Multi-level mode | Mask over entire area | Encode only multi-level images |
| Area designation mode | Mask over specified photo area | 2 layer encode |
| Automatic mode | Binarization over entire area | 2 layer encode |

As above described, according to the present invention, by encoding binary color signals obtained by converting multi-level color signals into binary form, and multi-level color signals with edge components removed, respectively, a binary color image containing edge information such as letters or lines can be encoded with less degradation and high compressibility, and a multi-level color image such as a color photograph can be also encoded without degradation at edge portions and with a high compressibility.

Note that the encoder B can encode by transforming R, G and B into Y, I and Q signals, or L*, a* and b* signals, or using R, G and B themselves.

The encode method is not limited to the above-mentioned dynamic arithmetic encoding, but the encoder A is preferable with an encode method of laying stress on the preservation of information (for example, Runlength, MH, MR, MMR), while the encoder B is preferable with an encode method of laying stress on the encode efficiency (for example, orthogonal conversion encoding such as ADCT method).

Further, binary color signals and multi-level color signals can be encoded with different encode methods, without removing edge components based on binary color signals.

[Third example]

Figure 19:
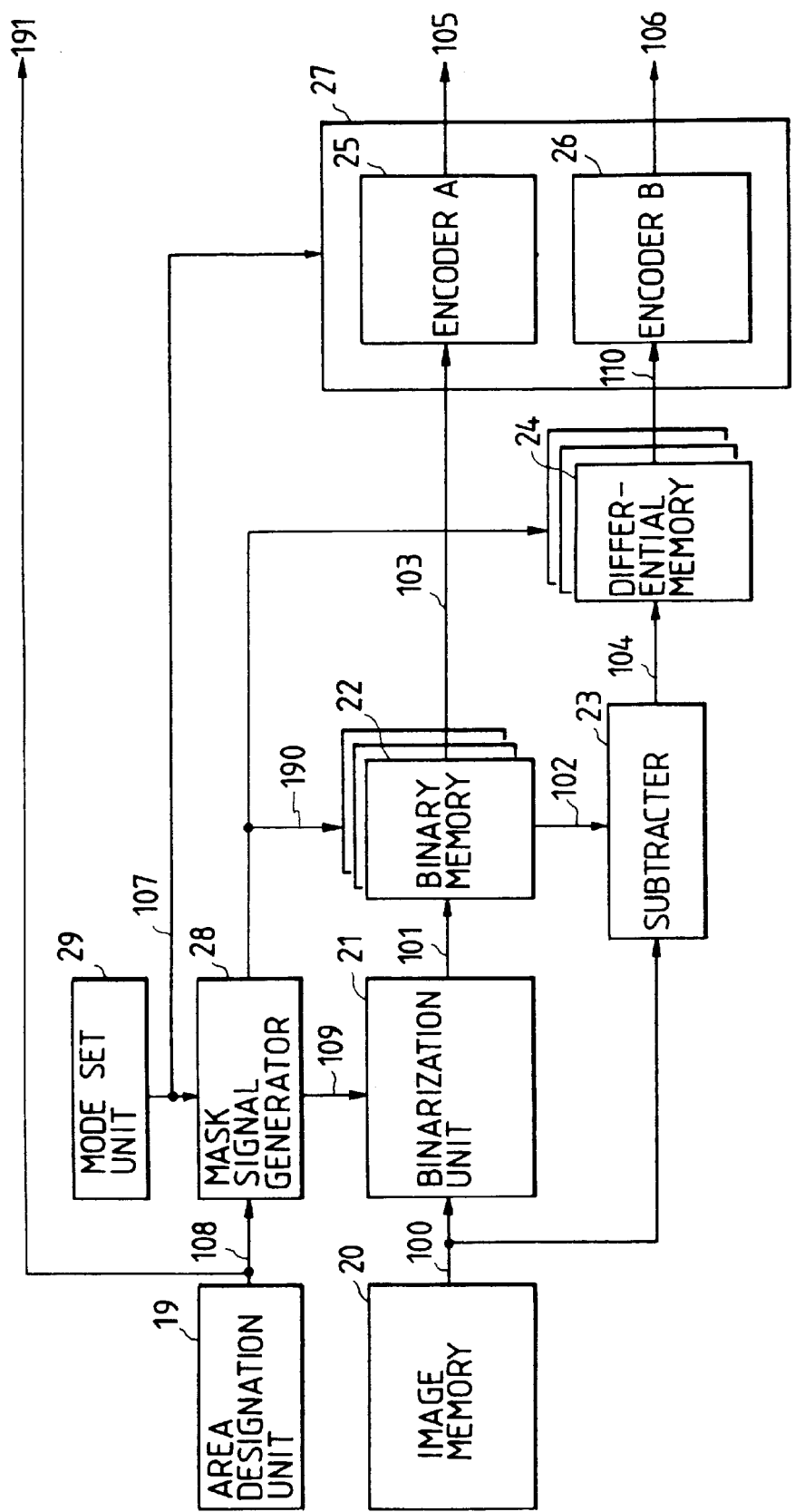
FIG. 19 is a view showing a configuration example of an encoder unit to which the present invention is applied.

FIG. 19 shows a configuration example of an encode unit in an image processing apparatus to which the present invention is applied.

In image memory 20 are stored color image signals of 8 bits each for red (R), green (G) and blue (B) representing a full-color image which was input from still color image input means such as a color scanner, not shown.

Image signals 100 for each color read from the image memory 20 are subjected to the binarization processing for each color in binarization circuit 21, converted into binary color signals consisting of one bit each for R, G and B, and stored in binary memory 22 for each color. Binary color signals 103 read from the binary memory 22 are subjected to the encode processing in an encoder A for encoding binary color signals, whereby codes 105 are output. The encode processing with this encoder A is the first encode processing.

The same color image signals, which have been subjected to the first encode processing as above indicated, are read from the image memory 20. The 8-bit signals 100 for R, G and B from the image memory 20 and the signals 102 (0→0, 1→255) obtained by level converting the output from the binary memory 22 into 8-bit signals are input into a subtracter 23, where the subtraction of the signals 100 from the signals 10 102 are performed for each color. These difference signals 104 are stored in a differential memory 24 for each color. The multi-level color signals 110 in the differential memory 24 are subjected to the encode processing in an encoder B for encoding multi-level color signals, whereby codes 106 are output. The encode processing with the encoder B as above described is the second encode processing.

Mode set unit 29 outputs a control signal 107 in accordance with the encode mode, as shown in Table 5, to a mask signal generator 28 and encoders 27, to control them as indicated in the following way. The above points are the same as for the first example.

(1) In the binary mode, the binarization processing with binarization circuit 21 is performed over the entire area, and the encode processing is restricted to only the first encode processing with the encoder A 25.

(2) In the multi-level mode, the mask generator 28 generates mask signals over the entire area so as to disable the binarization processing with the binarization circuit 21, so that the contents in the binary memory 22 are all made zero. The encode processing is restricted to only the second encode processing with the encoder B.

(3) In the area designation mode, the mask generator 28 generates mask signals 109 to mask the binarization processing with the binarization circuit 21 for the multi-level color image area specified by an area designation signal 108 from an area designation unit 19 specifying the multi-level color area. FIG. 15 is a view showing a masked area in the area designation mode, in which the masks for the binarization processing are applied to an area A 2001 and an area B 2002 within the entire image area 2000.

The area designation unit 19 may output the area designation signal 108 by automatically judging the multi-level color image area by means of a color image monitor, or in accordance with the area designation manually input with a keyboard or digitizer.

The encode processing in the area designation mode includes the second encode processing for encoding and transmitting multi-level color signals within an area specified as the multi-level color image area by the area designation unit 19 among the contents of differential memory 24, by means of the encoder B 26, as the first stage. And as the second stage, it includes the first encode processing for encoding and transmitting binary color signals outside the multi-level color image area among the contents of binary memory 22, by means of the encoder A 25.

Figures 21A, 21B, 21C:
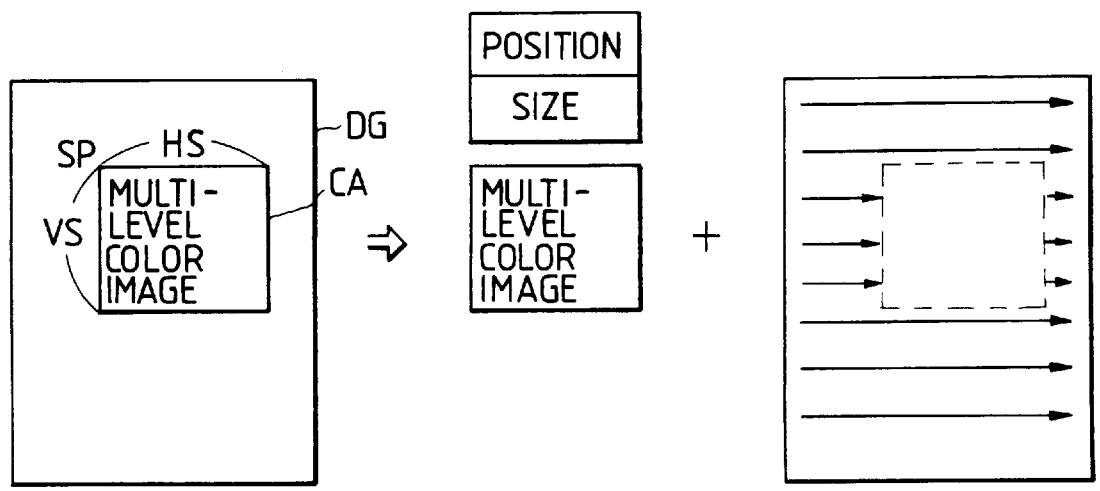
FIGS. 21A to 21C are views showing an operation example of the encode.
Figure 22:
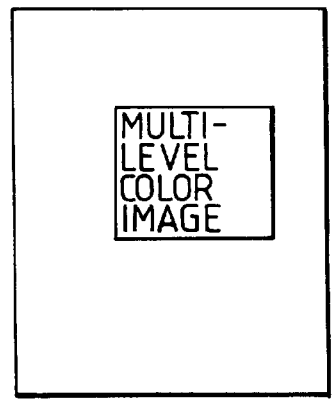
FIG. 22 is a view showing a color document example.

That is, as shown in FIGS. 21A to 21C, the second encode processing at the first stage is performed in such a way that multi-level color signals (FIG. 21B) within a multi-level image area CA in one screen OG as shown in FIG. 21A are read from the differential memory 24 in accordance with a mask signal 190 from the mask generator 28 and encoded. The first encode processing at the second stage is performed in such a way that binary color signals (FIG. 21C) outside the multi-level color image area CA are read from the binary memory 22 in accordance with the mask signal 190 and encoded.

As shown in FIG. 21B, the area designation signal 191 indicating the position and size of muti-level color image area CA must be transmitted prior to transmission of the encode data at the first stage. In decoding, the multi-level color image and the binary color image which have been decoded are synthesized, based on the area designation signal 191.

(4) In the automatic mode, the binary still color image is encoded for transmission in such a way that the entire area is converted into binary form with the binarization circuit 21, the resulting binary codes are stored in the binary memory 22, and then are subjected to the first encode processing with the encoder A 25. Next, a differential image 110 obtained by subtracting an original image from an image obtained by level-converting the binary image with subtracter 23, is subjected to the second encode processing with the encoder B 25 for the encode and transmission.

Figure 20:
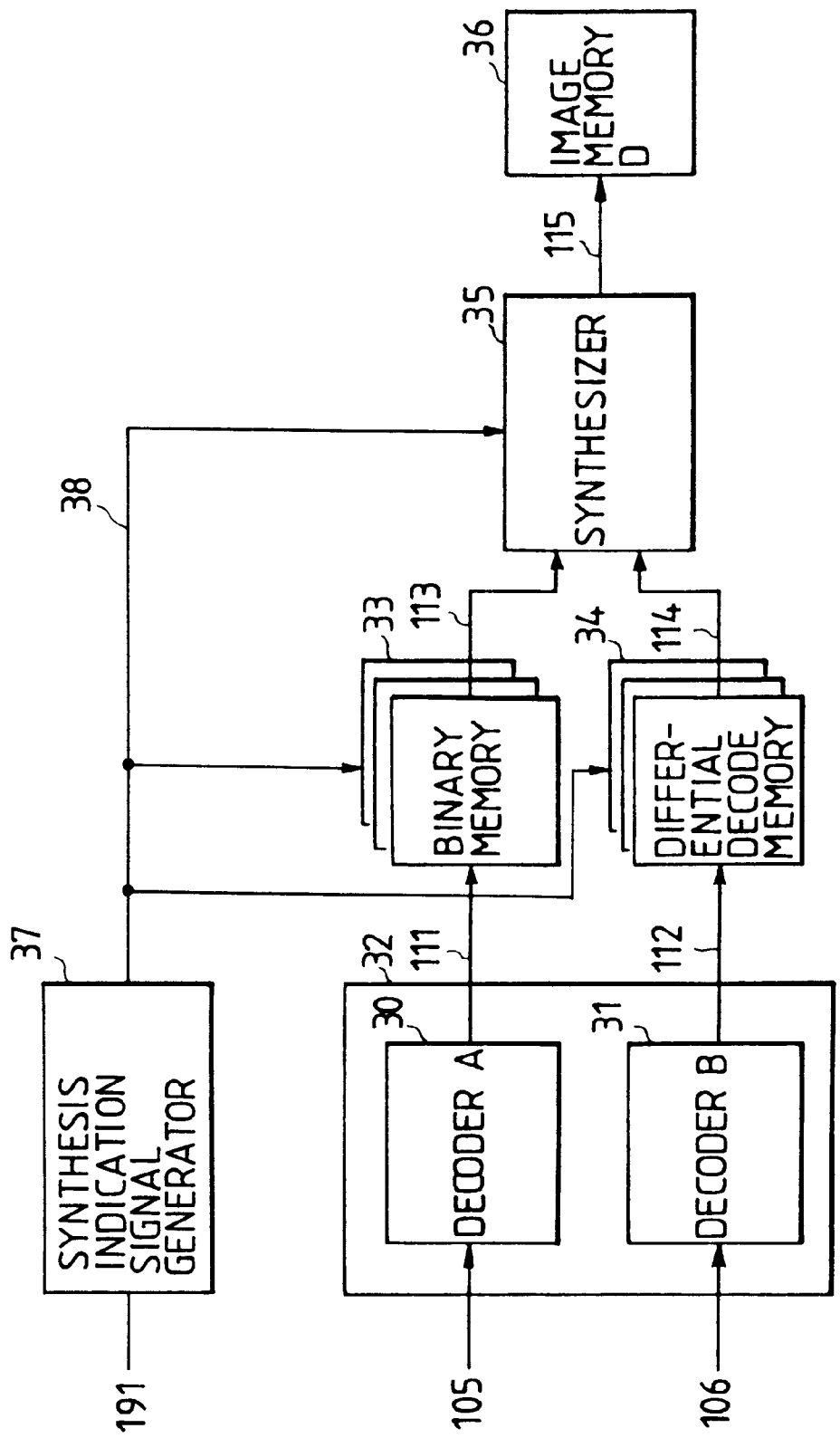
FIG. 20 is a view showing a configuration example of a decoder unit.

FIG. 20 shows a configuration example of a decoder to which the present invention is applied.

Codes 106 of the multi-level color image are restored into multi-level image data for each color with the decoder B 31, and stored in the differential memory 34. The stored data in the differential memory 34 correspond to differential signals within the muti-level color image area stored in the differential memory 24 as shown in FIG. 19. The storage area is determined by an area signal 38 from a synthesis indication signal generator 37, based on the area designation signal 191.

Codes 105 of the binary color image is restored into dot images for each color with the decoder A 30, and stored in the binary memory 33. This storage area is also determined by the area signal. The dot images correspond to binary signals outside the multi-level color image area stored in the binary memory 22 as shown in FIG. 19.

Synthesizer 35 synthesizes signals obtained by level converting one-bit signals 113 for each RGB from the binary memory 33 and the differential signals 114 from the differential memory 34, in accordance with the area signal 38, whereby signals 115 are obtained and stored in image memory D 36.

The image synthesis in the synthesizer 35 is performed by the inverse processing to that of the subtracter 23 as shown in FIG. 19, or in the manner that an original signal 203 is obtained by subtracting a signal 205 from a signal 204 as shown in FIG. 16.

It should be noted that in this example, the encode and transmission of the multi-level color image precede those of the binary color image, but they are restricted to this sequence, and the transmission of the multi-level color image is permitted after the encode and transmission of the binary color image.

As described above, according to the present invention, as multi-level color signals within a muti-level color image area and binary color signals outside the multi-level color image area are separately encoded, and a signal indicating the position and size of the multi-level color image area is generated, the encode of multi-level color signals and that of binary color signals are performed separately, so that the efficient encode of a color image can be achieved.

[Fourth example]

Figure 23:
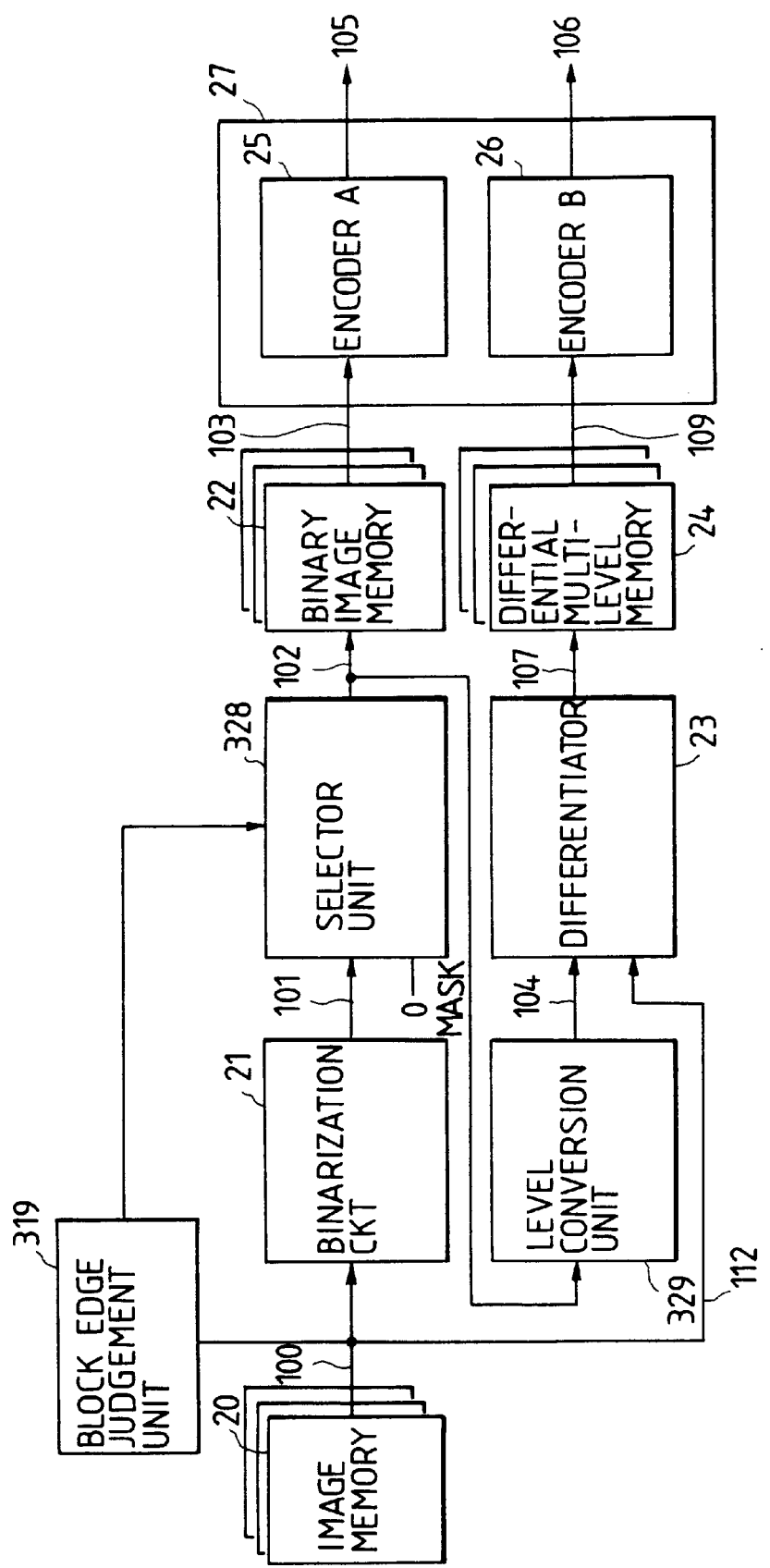
FIG. 23 is a view showing a configuration example of an encoder unit to which the present invention is applied.

FIG. 23 shows a configuration example of an encode unit in an image processing apparatus to which the present invention is applied. Parts having the same reference numbers are meant to take the same configurations as in FIG. 1.

In image memory 20 are stored color image signals of 8 bits each for red (R), green (G) and blue (B) representing a full-color image which was input from still color image input means such as a color scanner, not shown.

Multi-level color image signals 100 for each color read from the image memory 20 are subjected to the binarization processing for each color in binarization circuit 21, and converted into binary color signals 101 consisting of one bit each for R, G and B. The multi-level color image signals 100 are judged for each block of a predetermined size as to whether or not the block is at edge portion by a block edge judgment unit 319. In this example, the judgment is made whether a block with a unit of 8×8 image is at edge or non-edge portion.

Signals 101 converted into binary form with the binarization circuit 21 are masked with a mask signal 110 for each block in a selector unit 328.

That is, binarization signals 101 are selected for the blocks judged as edge by the block edge judgment unit 319, while a mask signal 110 is selected for the blocks judged as non-edge. Therefore, only edge image among the binary image is stored via line 102 into the binary image memory 22 for each color. Binary color signals 108 read from the binary color memory 22 are subjected to the encode processing in encoder A 25 for encoding binary color signals, whereby codes 105 are output.

Next, the same color image signals as those for the first encode processing as above indicated, are read from the image memory 20. And the portions except for binary edge image encoded by the first encode processing among the color image are encoded.

That is, the binary edge image output from the selector unit 328 is input via the line 102 into a level conversion unit 329. Here, the binary signals are converted in the range from 0.1 to 0.255 (8 bits).

The binary signals 104 level converted are subtracted from multi-lever color signals 112 by a differentiator 23. Differential signals are stored via line 107 into a differential multi-level memory 24 for each color of R, G and B. Multi-level color signals 109 read from the differential multi-level memory 24 are encoded by the encoder B 26 for encoding multi-level color signals, whereby codes 106 are output. The encode processing with the encoder B 26 as above described is the second encode processing.

Figure 24A:
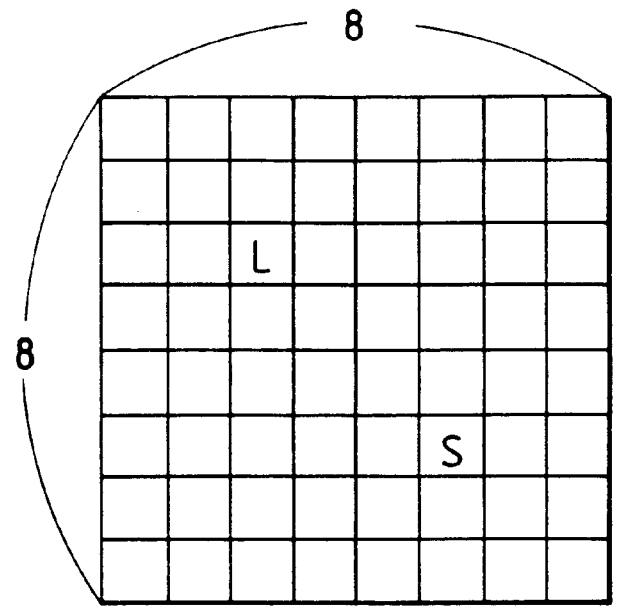
FIGS. 24A and 24B are views showing an edge judgment example.
Figure 24B:
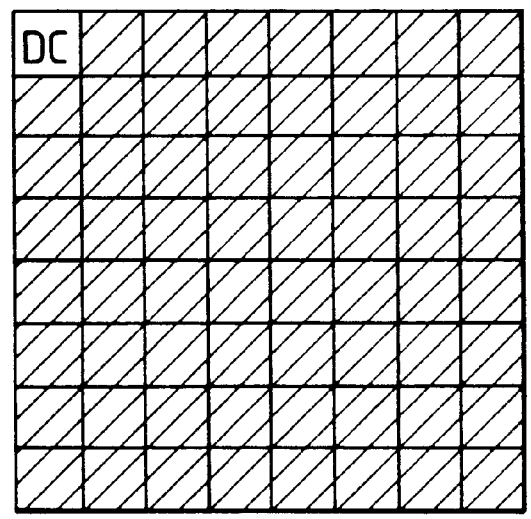

Block edge judgment unit 319 makes use of the following judgment in this example. FIGS. 24A and 24B show an example for judgment, where the detection of edges for each block is made for each of R, G and B (in this example, 8×8 pixels are used as one block, but a unit of block is not limited to it).

A detection method of edge used in FIG. 24A is performed in such a manner that the difference between the maximum value Max L and the minimum value Min S in a block is obtained, i.e., P=L−S, and if P is equal to or more than a predetermined value (T=70, providing that the whole level is 256), an edge exists.

In FIG. 24B, the DCT conversion is also made for each 8×8 block, and the absolute values of alternating current AC portions except for a direct current component DC among the converted coefficient are added. That is, if $$S = \sum_{i \neq DC} |AC|$$

is equal to or more than a predetermined value, the block is judged as the edge portion. With this method, the summation of AC coefficients is performed for slanting line portions, but a part of those coefficients can be used for the judgment.

FIG. 26 shows the relation between a muti-level color signal M read from the image memory 20, a binary edge image B and a differential multi-level image S. In this example, the edge judgment is made in two dimensions of a block with a unit of 8×8 pixels, but FIG. 26 shows an example where 8×8 pixel block is viewed in one dimension for the simplicity of explanation. For the blocks judged as edge, muti-level color image signals M are converted into binary form at a threshold TH, and then level-converted (0.255), so that the binary edge image B is obtained. A differential multi-level image S can be obtained by the absolute value of difference between M and B, i.e., S=|M−B|.

In this example, the absolute value of difference is considered, but this is because negative difference values should be avoided. The differential muti-level image S, as shown in FIG. 26, has a slash portion where the operation results of M−B become minus.

Consequently, the separation into the binary edge image B containing high-frequency components and the differential multi-level image S of low-frequency components is accomplished. Note that the threshold TH for binarization is preferable for TH>128 (in the case of 8 bits). If TH is small, the differential multi-level image is likely to contain high-frequency components.

In this example, the binary edge image can be encoded to preserve the full information with the entropy encode, so that the image quality at edge portions can be retained, while the differential image of low-frequency components is encoded with the multi-level encode which can not preserve the full information but has an excellent efficiency of encode, so that the highly efficient and excellent encode can be accomplished.

Further, by transmitting the binary color image having a less quantity of data at the first stage, the reception side can decode only those of the first stage and display them, thereby allowing received image to be confirmed promptly.

And at the second stage, the differential multi-level image is transmitted to the reception side, where they are decoded and added to the binary edge image decoded at the first stage, so that the hierarchical encode can be achieved.

The configuration of a decoder according to this example is the same as that in FIG. 3.

Codes 105 of the binary color image are decoded with a decoder A 30 into dot images for each color, and stored in binary memory 33. These dot images restore completely binary signals stored in binary image memory 22 as shown in FIG. 23. And codes 106 of the differential multi-level color image are restored into multi-level image data for each color with a decoder B 31, and stored in differential memory 34. The stored data in the differential memory 34 correspond to differential multi-level signals stored in the differential memory 24 as shown in FIG. 23.

Synthesizer 35 synthesizes signals obtained by level converting one-bit signals 113 for each of RGB from the binary memory 33 and the differential signals 114 from the differential memory 34, whereby signals 115 are obtained and stored in an image memory D 36. The image synthesis in the synthesizer 35 is performed by the same processing as that of the differential absolute processing in FIG. 24, i.e., in the manner that the multi-level color image signals are obtained by calculating M=|S−B|.

Further, the synthesizer 35 (FIG. 3) can use a method as shown in FIG. 25. That is, FIG. 25 is an explanation view similar to FIG. 26, showing a method that a multi-level color decode image M' is obtained from a binary edge decode image B' decoded from an encoded binary edge image and a differential muti-level decode image S'. In the example as shown in FIG. 25, the decode is accomplished with M'=S'∪B' (∪ indicates the logical sum). In other words, a high-level portion of the binary edge decode image B' that was level-converted is decoded with the logical sum M'.

With this method, there is an effect that color image portions of decode image, especially letters or lines, can be clearly decoded.

In the example as above described, both encoders A and B in the encoder 27 as shown in FIG. 23 use a dynamic arithmetic encoder, but can be implemented with different encoders.

Figure 27:
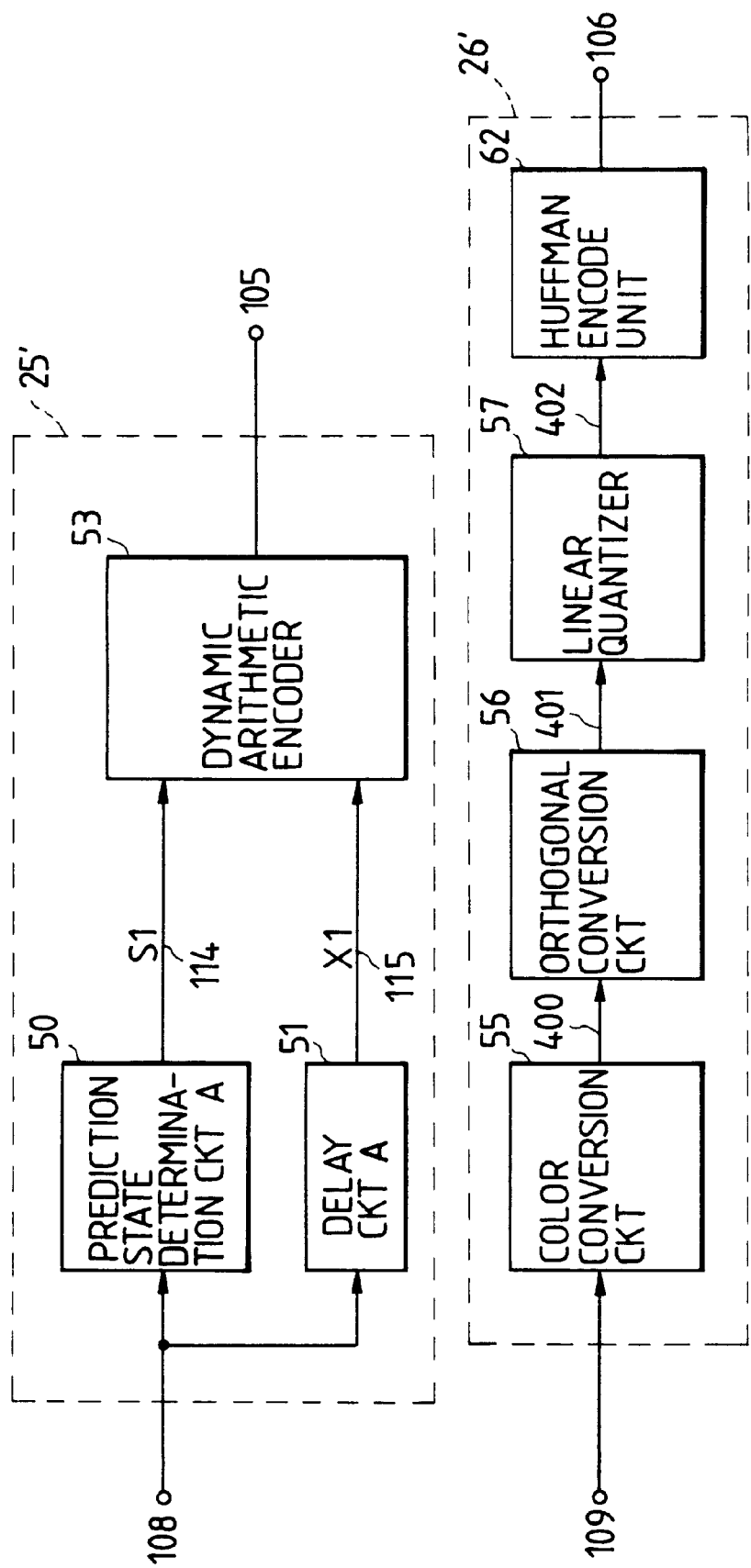
FIG. 27 is a view showing another configuration example of an encoder.

FIG. 27 shows an example for that. Note that same reference numbers are attached to blocks performing same functions as in FIG. 4.

Encoder A 25' and encoder B 26' encode the binary edge image and the differential multi-level image, respectively. In encoder A 25', a dynamic arithmetic code as described in FIG. 4 is used for the encode, while in encoder B 26', a well known DCT coefficient with the Huffman encode is used. That is, the DCT coefficient is scanned in zigzags, and the Huffman coefficient is assigned to the run having a zero coefficient and the next coefficient value. As above described, the encoders A and B can be formed with the separate encode methods appropriate to the respective image characteristics. It should be noted that this method allows two encode operations of the encoders A and B to be performed in parallel.

As above described, whether a multi-level color signal for each block is at edge portion is judged, and signals for the blocks at edge portions are entropyencoded after binarization, so that the binary color image containing edge portions such as letters or lines can be encoded with a less degradation and a high compressibility. And the multi-level color image with a lesser amount of edge portions such as a color photograph can be also encoded with a high compressibility because a low-frequency image from which edge portions are removed are encoded.

As above described, according to the present invention, the encode process is performed in such a way that whether an image is at an edge image is at edge or non-edge portion is judged for each block of a predetermined size, a binary color image obtained by converting a muti-level color image into binary form for the blocks which were judged as edge portions are encoded, with the first method, and further the difference between the binary color image and the multi-level color image for the blocks determined as edge portions, and the multi-level color image for the blocks determined as non-edge portions, are encoded with the second method, so that the multi-level color image, the binary color image, and further a color image containing both muti-level color image and binary color image can be efficiently and effectively encoded.

As above described, according to the present invention, a multi-level color image for blocks at edge portions is encoded with the first method of encoding binary color image obtained by converting multi-level color image into binary form, and the second method of encoding the difference between binary color image and multi-level color image, and decoded into the multi-level color image with the reverse conversion or logical sum of binary color data and differential data which were decoded, so that the degradation of image quality at edge portions is prevented, thereby the encode and decode of a color image can be accomplished with excellent color gradients.

The present invention is not limited to the above-described examples, but various variations and modifications may be made within the scope of the invention as defined by the appended claims.

We claim:

1. An image processing apparatus comprising:
   encoding means for encoding binary signals and multi-level color signals;
   binarization means for converting a muti-level color signal into a binary color signal;
   removal means for removing the edge component from the multi-level color signal, using a signal derived from the binary signal produced by said binarization means;
   first encoder means for encoding the binary signal from said binarization means and outputting first encoded data;
   second encoder means for encoding the muti-level color signal of which edge component is removed by said removal means and outputting second encoded data, and
   control means for controlling said second encoder means not to output the second encoded data.

2. An image processing apparatus according to claim 1, wherein said removal means comprises differential means arranged to produce a signal representative of the difference between the binary signal and the multi-level color signal.

3. An image processing apparatus according to claim 1, wherein said removal means comprises mask means arranged to mask the multi-level color signal with the binary signal.

4. An image processing apparatus according to claim 1, further comprising conversion means for converting the output of said binarization means into specified values.

5. An image processing apparatus according to claim 4, further comprising control means for controlling the operation of said conversion means in accordance with information relating to an area of the image.

6. An image processing apparatus according to claim 4, further comprising control means for controlling the operation of said conversion means in accordance with information relating to the encode mode.

7. An image processing apparatus according to claim 1, wherein said encoder means is a common encoding means for encoding the binary signals and the multi-level color signals in sequence.

8. An image processing apparatus according to claim 1, arranged such that multi-level color signals are encoded and transmitted after the binary signals are encoded and transmitted.

9. An image processing apparatus according to claim 1, wherein said control means is arranged to control said second encoder means, not to output the second encoded data, by not encoding the multi-level color signal having the edge component removed by said removal means.

10. An image processing method comprising the steps of:
    encoding binary signals and multi-level color signals;
    converting a multi-level color signal into a binary color signal;
    removing the edge component from the muti-level color signal, using a signal derived from the binary signal converted in said converting step;
    a first encoding step of encoding the binary signal converted in said converting step, and outputting first encoded data; and
    a second encoding step of encoding the muti-level color signal after removal of the edge component in said removing step, and outputting second encoded data, and cont
    rolling said second encoding step such that the second encoded data is not output in said second encoding step.

11. An image processing method according to claim 10, wherein said removing step comprises producing a signal representative of the difference between the binary signal and the multi-level color signal.

12. An image processing method according to claim 10, wherein said removing step comprises masking the multi-level color signal with the binary signal.

13. An image processing method according to claim 10, including the step of converting said binary color signal into specified values.

14. An image processing method according to claim 13, wherein said converting step is controlled in accordance with information relating to an area of the image.

15. An image processing method according to claim 13, said converting step is controlled in accordance with information relating to the encode mode.

16. An image processing method according to claim 10, wherein said binary signals and said multi-level color signals are encoded in sequence.

17. An image processing method according to claim 10, wherein the multi-level color signals are encoded and transmitted after the binary signals are encoded and transmitted.

18. An image processing method according to claim 10, wherein said second encoder step is controlled to output the second encoded data, by not encoding the muti-level color signal having the edge component removed during said removal step.

* * * * *